US008089050B2

(12) United States Patent  (10) Patent No.: US 8,089,050 B2
Purser et al.  (45) Date of Patent: Jan. 3, 2012

(54) METHOD AND APPARATUS FOR MODIFYING A RIBBON-SHAPED ION BEAM

(75) Inventors: Kenneth Harry Purser, Gloucester, MA (US); William H. Park, Somerville, MA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 212 days.

(21) Appl. No.: 12/621,689

(22) Filed: Nov. 19, 2009

(65) Prior Publication Data

US 2011/0114850 A1 May 19, 2011

(51) Int. Cl.
*H01J 3/36* (2006.01)
(52) U.S. Cl. ............ 250/396 ML; 250/492.21; 335/235
(58) Field of Classification Search ............ 250/492.21, 250/396 ML; 335/235
See application file for complete search history.

(56) References Cited

U.S. PATENT DOCUMENTS

| | | | |
|---|---|---|---|
| 3,541,328 A | 11/1970 | Enge | |
| 5,350,926 A | 9/1994 | White et al. | |
| 5,374,564 A | 12/1994 | Bruel | |
| 6,169,262 B1 | 1/2001 | Lee et al. | |
| 7,301,156 B2 | 11/2007 | Purser et al. | |
| 7,888,660 B2 | 2/2011 | Purser et al. | |
| 2011/0114849 A1* | 5/2011 | Sinclair et al. | 250/396 ML |
| 2011/0114850 A1 | 5/2011 | Purser et al. | |

OTHER PUBLICATIONS

Scheerer et al., 'Kinematic-Broadening Corrections in Nuclear Spectrometers', NIM 136, 213-224, 1976.
White et al, 'Applications of Accelerators in Research and Industry', p. 830, edited by J.L. Dugan and I. L. Morgan, published by the American Institute of Physics (1999).
Ziegler, J. F., ed., Ion Implementation-Science and Technology, Annapolis, MD: Ion Implantation Technology, Co., 2004, pp. 12-12 to 12-40, 13-1, 13-19 to 13-41, and 14-1 to 14-37.
Ziegler, J. F., ed., Ion Implementation-Science and Technology, Poughkeepsie, NY: Ion Implantation Technology, Co., 1996, pp. ii-v, 391-427, and 442-510.
Notice of Allowance dated Sep. 6, 2011 for U.S. Appl. No. 12/703,194.

\* cited by examiner

*Primary Examiner* — Jack Berman
(74) *Attorney, Agent, or Firm* — The Mueller Law Office, P.C.

(57) ABSTRACT

A ribbon-shaped ion beam is modified using multiple coil structures on a pair of opposed ferromagnetic bars. The coil structures comprise continuous windings which have predetermined variations along the length of the bar of turns per unit length. In an example, one coil structure may have uniform turns per unit length along the bar, so that energizing the coil structures forms a magnetic field component extending across the gap between the bars with a quadrupole intensity distribution. A second coil structure may have turns per unit length varying to produce a hexapole magnetic field intensity distribution. Further coil structures may be provided to produce octopole and decapole magnetic field distributions. The coil structures may be energized to produce magnetic fields parallel to the bars which vary along the length of the bars, to twist or flatten the ribbon-shaped beam.

29 Claims, 22 Drawing Sheets

FIG. 24A   FIG. 24B   FIG. 24C   FIG. 24D

METHOD AND APPARATUS FOR MODIFYING A RIBBON-SHAPED ION BEAM

BACKGROUND

1. Field of the Invention

This invention relates to ion implantation and in particular to a method of modifying a ribbon-shaped ion beam which has an elongate cross-section normal to a beam direction, and also to apparatus for modifying such a ribbon-shaped ion beam.

2. Background Information

Ribbon-shaped ion beams are known to be used for implanting ions into substrates, particularly semiconductor substrates as used in the semiconductor manufacturing industry. Typically, such semiconductor substrates comprise relatively thin wafers of the substrate, commonly formed of monocrystalline silicon. Wafers of monocrystalline silicon may be circular with a diameter of about 200 or about 300 mm, although other shapes and dimensions may be used. A ribbon-shaped ion beam can be used for implanting ions into such wafers, in which case the ribbon-shaped ion beam may be controlled to have an elongate cross-section at the location of the wafer to be implanted which has a length just greater than the diameter of the wafer. Then, in order to ensure an even implantation of ions over the entire surface of the wafer, it may be necessary only to produce relative movement between the ribbon-shaped ion beam and the wafer in a direction perpendicular to the elongate cross-section direction of the ion beam.

It is a known requirement in the field of ion implantation into semiconductor substrates, that the dose of ions being implanted should be delivered evenly over the entire surface of the wafer. To achieve this, it is therefore important that the ribbon-shaped ion beam has an even distribution of intensity over the width of the elongate cross-section of the ion beam at the location of the wafer being implanted. Intensity non-uniformity over the elongate cross-section of the ribbon beam can be caused at the ion source, through a number of processes, including errors in the alignment of extraction electrodes, temperature effects, and physical changes causing plasma non-uniformity within the ion source chamber. It is therefore become a common practice in the production of ribbon-shaped beams for ion implantation, to employ a beam line profilometer, which can measure intensity variations across the ribbon beam, in combination with some suitable uniformity correction apparatus.

A known apparatus for modifying a ribbon-shaped ion beam has a high magnetic permeability rectangular steel structure defining an elongate open space which accommodates the ribbon-shaped beam passing through the rectangular structure with the length of the elongate open space aligned with the long cross-section of the ribbon beam. Multiple individual coils are distributed along each of the long bars of the rectangular steel structure, with individual controllable power supplies establishing current through each of the coils. These multiple coils may be energized to produce selected field distributions in the open space within the rectangular steel structure, including quadrupole, other multipole field distributions and other useful magnetic field distributions.

It is also known to employ quadrupole and other multipole field distributions in the field of magnetic spectography, for correcting aberrations in the trajectories of particles travelling through a spectrograph. The technical considerations for magnetic spectrographs are, however, very different compared to those applicable for a ribbon-shaped beam used in an ion implanter. Most particularly, space charge considerations are normally completely absent in magnetic spectrograph applications, as there is seldom more than a single charged particle traversing any region of a spectrograph at any time. In general, the considerations relating to the correction of optical aberrations along the charged particle path of a magnetic spectrograph are quite different from the considerations mentioned above for modifying, and improving the uniformity, of a ribbon-shaped ion beam in the ion implantation of semiconductor substrates.

BRIEF SUMMARY OF THE INVENTION

In considering a ribbon-shaped ion beam, it is convenient to establish an orthogonal (x, y, z) Cartesian co-ordinate system which is independent of the position along the beam. Accordingly, for a ribbon-shaped ion beam having an elongate cross-section normal to a beam direction, there is defined at any position along the ribbon-shaped beam an orthogonal (x, y, z) Cartesian co-ordinate system, in which a z-axis of the co-ordinate system extends in the beam direction at a center line of said ribbon-shaped beam, an x-axis extends in a long direction of said elongate cross-section of said ribbon-shaped beam, and a y-axis extends in a short direction of said elongate cross-section.

One aspect of the invention provides a method of modifying this ribbon-shaped ion beam, comprising the steps of providing opposed ferromagnetic bars each having a length and defining between them an elongate open space to accommodate said ribbon-shaped beam passing between the bars with the x-axis of the beam extending along a length of said elongate space. There is then provided on each of said opposed ferromagnetic bars, a respective first coil structure comprising a continuous winding which has a first predetermined distribution along said length of the bar of turns per unit length, said first predetermined distribution being selected to provide, when said coil structures are selectively energized, a first component magnetic field in a y-direction in said elongate open space between said opposed ferromagnetic bars, said first component magnetic field having a corresponding first distribution of magnetic field intensity over said length of said open space in an x-direction. There is additionally provided on each of said opposed ferromagnetic bars, at least a respective second coil structure comprising at least one continuous winding which has a second predetermined distribution along said length of the bar of turns per unit length, said second predetermined distribution being selected, when said second coil structure are selectively energized, a second component magnetic field in said y-direction in said elongate open space between said opposed ferromagnetic bars, said second component magnetic field having a corresponding second distribution of magnetic field intensity over at least a part of said length of said open space in said x-direction. The method is performed by passing said ribbon-shaped beam through said elongate open space between said opposed ferromagnetic bars, and selectively energizing said respective first and second coil structures with electric currents to apply a desired modification to said ribbon-shaped ion beam.

In one example of the method, there is the additional step of providing, on each of said opposed ferromagnetic bars as said respective second coil structure, a further continuous winding in addition to said one continuous winding, said one and said further continuous windings being located on opposite sides of a mid-point of the length of said ferromagnetic bar and together providing said second predetermined distribution of terms per unit length, whereby said second component magnetic field provided when both said one and said further continuous windings are selectively energized has said corresponding second distribution of magnetic field intensity over the length of said elongate space. Said one and said further continuous windings of said second coil structures are energized selectively and independently.

Said first and second distributions of magnetic field intensities may be multipole distributions of respective different orders. For example, said first distribution of magnetic field intensity may be a quadrupole distribution and said second distribution of magnetic intensity may be a hexapole distribution. Additionally, third and fourth coil structures may be provided on the opposed ferromagnetic bars, which can be selectively energized to provide third and fourth component magnetic fields having corresponding third and fourth distributions of magnetic field intensity over said x-direction. These third and fourth coil structures may be designed to provide respectively octopole and decapole magnetic field intensity distributions.

In another aspect of the present invention, apparatus for modifying the ribbon-shaped beam discussed above, comprises a pair of opposed ferromagnetic bars each having a length and defining between them an elongate open space to accommodate said ribbon-shaped beam passing between the bars with the x-axis of the beam extending along a length of said elongate space. There is a respective first coil structure on each of said opposed ferromagnetic bars, wherein said respective first coil structures each comprise a continuous winding and have a first predetermined distribution along said length of the bar of turns per unit length, said first predetermined distribution being selected to provide, when said first coil structures are selectively energized, a first component magnetic field transversely across said elongate space between said opposed bars, said first component magnetic field having a corresponding first distribution of magnetic field intensity over said length of said elongate open space. There is then also at least a respective second coil structure, on each of said opposed ferromagnetic bars, wherein said respective second coil structures each comprise a pair of continuous windings on opposite sides of a mid-point of the length of the respective said ferromagnetic bar, said pair of continuous windings having a second predetermined distribution of turns per unit length, along the length of the bar, wherein said second predetermined distribution is selected to provide, when said second coil structures are selectively energized, a second component magnetic field transversely across said elongate open space between said opposed ferromagnetic bars, said second component magnetic field having a corresponding second distribution of magnetic field intensity over said length of said elongate space. There are respective power supply leads to said continuous winding of each of said first coil structure and to each said pair of continuous windings of each said second coil structure.

In one embodiment, the apparatus may further comprise a respective third coil structure on each of said opposed ferromagnetic bars, wherein said respective third coil structures each comprise a pair of continuous windings on opposite sides of the mid-point of the length of the respective said ferromagnetic bar, said pair of continuous windings having a third predetermined distribution of turns per unit length, along the length of the bar, wherein said third predetermined distribution is selected to provide, when said third coil structures are selectively energized, a third component magnetic field transversely across said elongate open space between said opposed ferromagnetic bars, said third component magnetic field having a corresponding third distribution of magnetic field intensity over said length of said elongate open space; and further respective power leads to each of said pair of continuous windings of each said third coil structure.

In a further embodiment the apparatus may further comprise a respective fourth coil structure on each of said opposed ferromagnetic bars, wherein said respective fourth coil structures each comprise a pair of continuous windings on opposite sides of the mid-point of the length of the respective said ferromagnetic bar, said pair of continuous windings having a fourth predetermined distribution of turns per unit length, along the length of the bar, wherein said fourth predetermined distribution is selected to provide, when said fourth coil structures are selectively energized, a fourth component magnetic field transversely across said elongate open space between said opposed ferromagnetic bars, said fourth component magnetic field having a corresponding fourth distribution of magnetic field intensity over said length of said elongate open space; and further respective power leads to each of said pair of continuous windings of each said fourth coil structure.

In embodiments of the invention, said first, second, third and fourth distributions of turns per unit length of said continuous windings of said first, second, third and fourth coil structures are respectively designed so that said corresponding first, second, third and fourth distributions of magnetic field intensity are respectively quadrupole, hexapole, octopole and decapole distributions.

In a still further embodiment, each of said opposed ferromagnetic bars carries a corresponding even number of coil units distributed evenly along the respective said bar symmetrically on either side of said mid-point of said bar, and each of said coil units carries coil turns of said windings of a plurality of said coil structures, wherein the number of said coil turns in respect of said coil units for each of said coil structures is determined in accordance with the respective said predetermined distribution of turns per unit length of the respective said coil structure.

In a further aspect of the present invention, there is provided a method of modifying a ribbon-shaped ion beam as described above, where the method comprises the steps of generating at a predetermined position along the ribbon-shaped beam a magnetic field extending in an x-direction along said x-axis, said x-direction magnetic field having a non-uniform intensity which is a desired function of x. This x-direction magnetic field may have a component which has an intensity varying as a linear function of x. Instead or as well, this x-direction magnetic field may have a component which has an intensity varying as a non-linear function of x.

Said magnetic field extending in said x-direction may be generated by providing a magnetic field device having an opening with x and y orthogonal dimensions to accommodate said ribbon-shaped beam passing said device through said opening with the x-axis of the beam extending in said x dimension, said magnetic field device having electric coil structures adapted, when selectively energized, to provide said magnetic field in said opening extending in said x-direction along said x-dimension of said opening, and selectively energizing said electric coil structures to generate said x-direction magnetic field having said non-uniform intensity in said opening. Said electric coil structures may comprise multiple coil windings, and said coil windings may be selectively energized to generate said x-direction magnetic field having a non-uniform intensity varying as a selected one of a plurality of desired functions of x.

In a still further aspect, there is provided a method of generating a high current, high energy ribbon-shaped beam of ions for implantation, comprising the steps of extracting ions from an ion source to provide an extracted ion beam having a first energy and forming a ribbon-shaped beam in an (x, y, z)

Cartesian co-ordinate system as described above. The ribbon-shaped beam is accelerated from said first energy to a second energy by directing the beam through an acceleration assembly containing a plurality of apertured electrodes biased to provide an electrostatic accelerating field along an axis of said assembly. The assembly includes an entrance plate having a beam defining aperture slot on said axis to receive said ribbon-shaped beam, said aperture slot having a long dimension which is linear. At a position in front of said entrance plate, a magnetic field is generated extending in an x-direction along the x-axis of the ribbon-shaped beam to apply selected y deflections about said x-axis to ions of said ribbon-shaped beam, in order to direct said ribbon-shaped beam through said aperture slot.

This x-direction magnetic field may have a non-uniform intensity which is a desired function of x. In particular, the x-direction magnetic field may have a component which varies as a linear function of x, such as to bring the x-axis of said ribbon-shaped beam at said entrance plate into alignment with said linear long dimension of said aperture slot.

Alternatively, or as well, said x-direction magnetic field may have a component which varies with a non-linear function of x, such as to flatten said ribbon-shaped beam along said x-axis at said entrance plate.

A still further aspect of the invention provides apparatus for modifying a ribbon-shaped beam in an orthogonal (x, y, z) Cartesian co-ordinate system as described above. The apparatus comprises a magnetic field device having an opening with x and y orthogonal dimensions to accommodate said ribbon-shaped beam passing said device through said opening with the x-axis of the beam extending in said x dimension. The magnetic field device has electric coil structures adapted, when selectively energized, to provide a magnetic field in said opening extending in an x-direction along said x dimension of said opening, said x-direction magnetic field having a non-uniform intensity which is a desired function of the distance along said x dimension. Programmable power supplies are connected to deliver predetermined currents to windings of said electric coil structures, wherein said programmable power supplies are arranged to deliver said predetermined currents such as to energize said coil structures to provide said x-direction magnetic field.

In an embodiment, said electric coil structures are designed and said programmable power supplies are arranged to deliver said predetermined currents such that said x-direction magnetic field has a component which has an intensity varying as a linear function of said distance along said x dimension. Instead or as well, said electric coil structures may be designed and said programmable power supplies may be arranged to deliver said predetermined currents such that said x-direction magnetic field has a component which has an intensity varying as a non-linear function of said distance along said x dimension.

The magnetic field device may comprise opposed ferromagnetic bars, each having a length and defining between them an elongate open space to accommodate said ribbon-shaped beam passing between the bars with the x-axis of the beam extending along a length of said elongate space, and corresponding said electric coil structures on each of said opposed bars. Then, said electric coil structures may comprise multiple coil windings, and said programmable power supplies may be connected and arranged to drive selected currents in said windings to generate said x-direction magnetic field so as to have said non-uniform intensity varying as a selected one of a plurality of desired functions of x.

In a still further aspect of the invention, there is provided apparatus for generating a high current, high energy ribbon shaped beam of ions for implantation, comprising an ion source and ion extraction optics to provide a ribbon-shaped beam of ions for implantation having a first energy. Said ribbon-shaped beam has an elongate cross-section normal to a beam direction and an orthogonal (x, y, z) Cartesian co-ordinate system is defined for the beam as described above. The apparatus has an acceleration assembly having an axis and containing a plurality of apertured electrodes adapted to be biased to provide an electrostatic accelerating field along said axis of said assembly. The acceleration assembly includes an entrance plate having a beam defining aperture slot on said axis to receive said ribbon-shaped beam, said aperture slot having a long dimension which is linear. The magnetic field device is located in front of said entrance plate, said magnetic field device having an opening with x and y orthogonal dimensions to accommodate said ribbon-shaped beam passing said device through said opening with the x-axis of the beam extending in said x dimension. Said magnetic field device has electric coil structures adapted, when selectively energized, to provide a magnetic field in said opening in an x-direction along said x dimension of said opening so as to apply selected y deflections about said x-axis of ions of said ribbon-shaped beam, in order to direct said ribbon-shaped beam through said aperture slot. Programmable power supplies are connected to deliver predetermined currents to windings on said electric coil structures, wherein said programmable power supplies are arranged to deliver said predetermined currents such as to energize said coil structures to provide said x direction magnetic field. Said magnetic field device may be adapted and said programmable power supplies may be arranged such that, when energized, said electric coil structures provide said x-direction magnetic field with a non-uniform intensity which is a desired function of the distance along said x-dimension.

In an embodiment, said magnetic field device may adapted and said programmable power supplies may be arranged such that, when energized, said electric coil structures provide said x-direction magnetic field having a component which varies with a linear function of said distance along said x-dimension, such as to bring the x-axis of said ribbon-shaped beam at said entrance plate into alignment with said linear long dimension of said aperture slot. Instead or as well, said magnetic field device may be adapted and said programmable power supplies may be arranged such that, when energized, said electric coil structures provide said x-direction magnetic field having a component which varies with a non-linear function of said distance along said x-dimension, such as to flatten said ribbon-shaped beam along said x-axis at said entrance plate.

BRIEF DESCRIPTION OF THE DRAWINGS

Examples of the invention will now be described below with reference to the accompanying drawings in which:

FIGS. 24A, 24B, 24C and 24D illustrate the corrective action provided by various distributions of x-direction magnetic field produced by the ribbon beam modifying structure of FIG. 11.

DETAILED DESCRIPTION OF THE INVENTION

Figure 1:
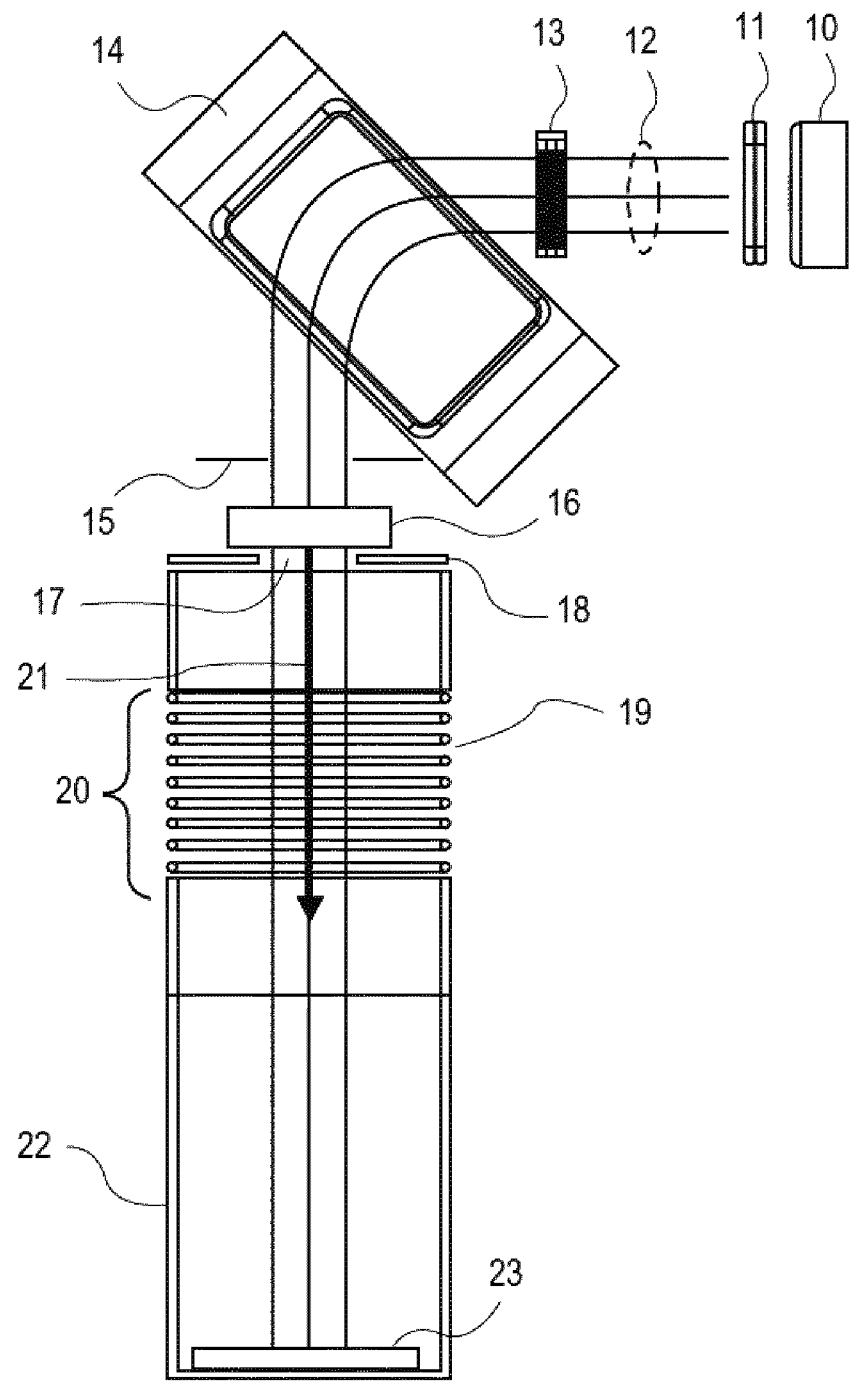
FIG. 1 is a schematic view of an ion implanter with which examples of the method of the invention may be practiced and embodiments of the apparatus of the invention may be incorporated.

FIG. 1 is a schematic representation of ion implantation apparatus which can embody the present invention. Ion implantation is conducted in a vacuum environment, but the walls of the vacuum chamber are not illustrated in FIG. 1 for simplicity.

In FIG. 1, an ion beam is generated at an ion source 10. The ion source 10 may comprise, for example, a Bernas type source including a discharge chamber in which a plasma is formed containing ions of the species desired for implantation. Plasma ions are extracted from the chamber by electrically biased extraction electrodes 11 to form a beam 12 of extracted ions. This beam 12 of extracted ions has an initial or first beam energy corresponding to the bias voltage of the source 10 relative to elements of the beam line through which the ion beam passes.

The ion beam 12 extracted from the source 10 has a ribbon shape with an elongate cross-section normal to the beam direction. In FIG. 1, the elongate cross-section of the beam extends in the plane of the paper. The extracted ribbon-shaped beam 12 passes through a beam modifying structure 13 which will be described in detail below. In brief, the beam modifying structure 13 uses magnetic fields to apply small deflections to ions of the beam, in the plane of the ribbon-shaped beam, for the purpose of correcting non-uniformities in the intensity of the beam over the long dimension of the elongate cross-section of the ribbon.

This is to enable the beam to have a uniform intensity over the long dimension of the cross-section of the ribbon, when the ribbon beam impacts a substrate to be implanted. Then, physical movement of the substrate to be implanted across the ribbon beam, in a direction orthogonal to the long dimension of the ribbon beam cross-section, can provide a uniform implant dose across the implanted surface of the substrate.

It will be understood that the beam modifying structure introduces small angular deflections to ions of the ribbon beam. The amount of angular deflection needed to redistribute particular ions over the long dimension of the ribbon beam cross-section is, of course, dependant on the distance the beam travels and any energy gained or lost between passing through the beam modifying structure 13, and reaching the substrate to be implanted.

After passing through the beam modifying structure 13, the ribbon-shaped beam 12 passes through a dipole magnet structure 14, which applies a dipole magnetic field in a direction orthogonal to the plane of the ribbon-shaped beam, so that the beam is bent substantially in the ribbon plane. In the example of FIG. 1, the beam is bent through about 90°.

The ribbon-shaped beam 12 emerging from the dipole magnet structure passes through a selection aperture 15. As is well understood, the dipole magnet structure 14 acts on the ions of beam 12 as a momentum filter, so that ions in the extracted beam of different momenta are bent through different angles.

In one application of this embodiment of the invention, the ions intended for implantation in the substrate may be $H^+$ ions. The dipole magnet structure 14 in combination with the selection aperture 15 are effective to eliminate from the ribbon-shaped beam passing through the selection aperture 15 unwanted ions, including for example $D^+$, $HD^+$ and $H_2^+$.

After the selection aperture, the ribbon-shaped beam, now containing only desired ions for implantation, passes a beam profile measurement system 16 before entering an entrance beam defining aperture 17 in an entrance plate 18 of an acceleration assembly 19. The acceleration assembly 19 contains a plurality of apertured electrodes 20. The apertured electrodes 20 can be biased to provide an electrostatic accelerating field along a central axis 21 of the acceleration assembly 19.

The acceleration assembly 19 uses high electrostatic voltages to accelerate the ribbon-shaped beam 12 to a relatively high implant energy as required for the implant process.

In an example, the ribbon-shaped beam 12 extracted from the ion source 10 by the extraction electrodes 11 has an initial first energy of about 100 keV. The acceleration assembly 19 accelerates the ribbon-shaped beam to a final implant energy of about 420 keV.

In this example, where the ribbon-shaped beam contains $H^+$ ions, such high energy $H^+$ ions are useful in the process of exfoliation of silicon, to produce very thin films of crystalline silicon, which are used for example for the fabrication of photovoltaic cells.

In the example of FIG. 1, the ribbon-shaped beam after acceleration through the apertured electrodes 20 enters a process chamber, illustrated schematically at 22, in which the beam is directed at substrates to be implanted, illustrated in FIG. 1 by wafer substrate 23.

In practice, the process chamber 22 may contain a process wheel on which a plurality of substrate wafers are mounted. Rotation of the process wheel is then used to pass the substrate wafers one after the other through the ribbon beam. A suitable process chamber which may be used in embodiments of the present invention is disclosed in U.S. patent application Ser. No. 12/494,269 to Ryding, which is assigned to the assignee of the present invention. The disclosure of this US Patent Application is incorporated herein by reference in its entirety for all purposes.

Figure 2A:
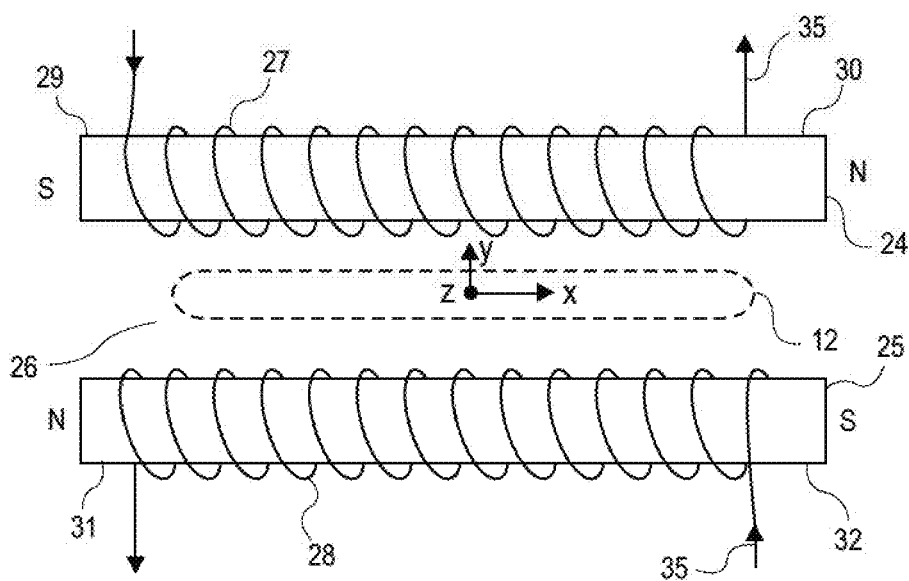
FIG. 2A in combination with FIGS. 2B and 2C provide a schematic illustration of an embodiment of the invention.

An example of the beam modifying structure 13 will now be described. FIG. 2A illustrates schematically a pair of opposed ferromagnetic bars 24 and 25. Each of the bars 24 and 25 has a length which exceeds the long dimension of the cross-section of the ribbon-shaped beam in the long direction of said elongate cross-section.

In FIG. 2A, a ribbon-shaped beam 12 is illustrated passing between the ferromagnetic bars 24 and 25. According to convention, at any position along the ribbon-shaped beam, there is defined an orthogonal (x, y, z) Cartesian co-ordinate system, in which a z-axis of the co-ordinate system extends in the beam direction at a center line of the ribbon-shaped beam, an x-axis extends in the long direction of the elongate cross-section of the ribbon-shaped beam and a y-axis extends in the short direction of said cross-section. This x, y, z, co-ordinate system is illustrated in FIG. 2A, with the z-axis, extending straight out of the paper towards the viewer.

Accordingly, as shown in FIG. 2A, the ribbon-shaped beam passing between the ferromagnetic bars 24 and 25 is accommodated in an elongate open space 26 defined between the bars 24 and 25. The x-axis of the beam extends along a length of said elongate space 26. In this example, the ferromagnetic bars 24 and 25 are parallel to each other and the x-axis of the ribbon-shaped beam is, in turn, parallel to the two bars 24 and 25. The y-axis of the beam extends across said elongate space 26 and is orthogonal to the bars 24 and 25, so that the z-axis, the beam direction, is normal to a plane containing the two bars 24 and 25.

Each of the two ferromagnetic bars 24 and 25 carries a number of electric coil structures. FIG. 2A illustrates each ferromagnetic bar 24 and 25 carrying a respective first coil structure 27, 28. The respective first coil structures 27 and 28 each comprise a continuous winding on the respective bar 24, 25, extending over most of the length of the respective bar between opposite ends 29, 30 of the bar 24, and opposite ends 31, 32 of the bar 25.

Figure 2B:
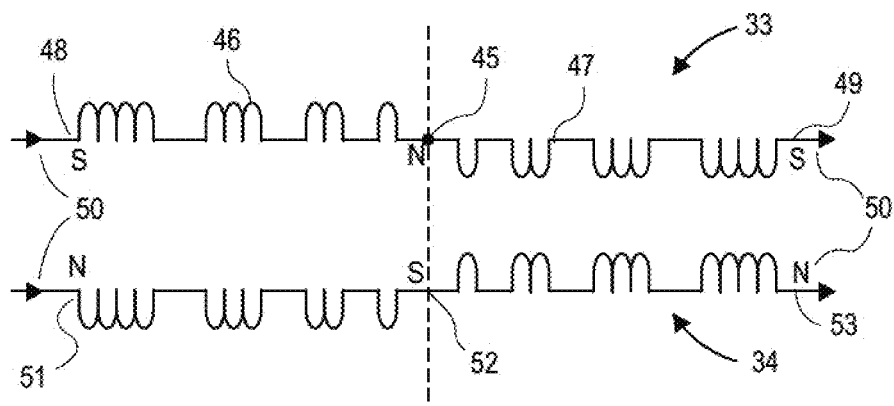

In accordance with embodiments of the invention, each of the opposed ferromagnetic bars 24 and 25 carries also a second respective coil structure. For clarity, the second respective coil structures are not illustrated in FIG. 2A, but are schematically illustrated in FIG. 2B and identified by the references 33 and 34. In this example, each of the second coil structures comprises a continuous winding which also extends over at least a substantial part of the length of the respective bar 24, 25. The continuous winding of each of the second coil structures 33, 34 may be wound on top of the respective continuous windings of the first coil structures 27, 28.

The continuous winding of each of the first coil structures 27, 28 is arranged to have a first predetermined distribution of turns per unit length along the length of the respective bar 24, 25. This first predetermined distribution of turns per unit length is selected to provide, when the first coil structures are selectively energized with electric currents, a first component magnetic field in the elongate open space between the ferromagnetic bars 24 and 25.

In the example illustrated in FIG. 2A, the continuous windings of the first coil structures are wound with a uniform distribution of turns per unit length along the length of the respective bar 24, 25. Also in the illustrated example, the continuous winding of the first coil structures 27 and 28 on the respective bars 24 and 25 are wound with the same hand, clockwise in the drawings. However, when these coil structures 27 and 28 are energized with currents that flow around the bars with opposite hand as illustrated by arrows 35 in FIG. 2A, it can be understood that the upper ferromagnetic bar 24 is magnetized to have a North pole at the right hand end 30 of the bar in the Figure, and the lower ferromagnetic bar 25 is magnetized to have a North pole at the left hand end 31 of the bar in the Figure. As a result, juxtaposed ends 30 and 32 of the respective bars 24 and 25 have North and South poles respectively and juxtaposed ends 29 and 31 of the bars 24 and 25 respectively, have opposed South and North poles respectively. This arrangement produces in the elongate space 26 between the bars 24 and 25 a magnetic field extending in the y direction of the y-axis, between the bars 24 and 25, which has a quadrupolar distribution of intensity over the length of said open space 26 in the x-direction. Accordingly, in this example, the first coil structures have a first predetermined distribution along the length of the bar of turns per unit length, which provides, when the first coil structures 27 and 28 are selectively energized as described above, a first component magnetic field in the y direction in the elongate space 26 between the opposed bars 24 and 25, which first component magnetic field has a first distribution of magnetic field intensity over the length of said open space 26 in the x-direction. This first distribution of magnetic field intensity is a quadrupolar distribution.

Figure 4:
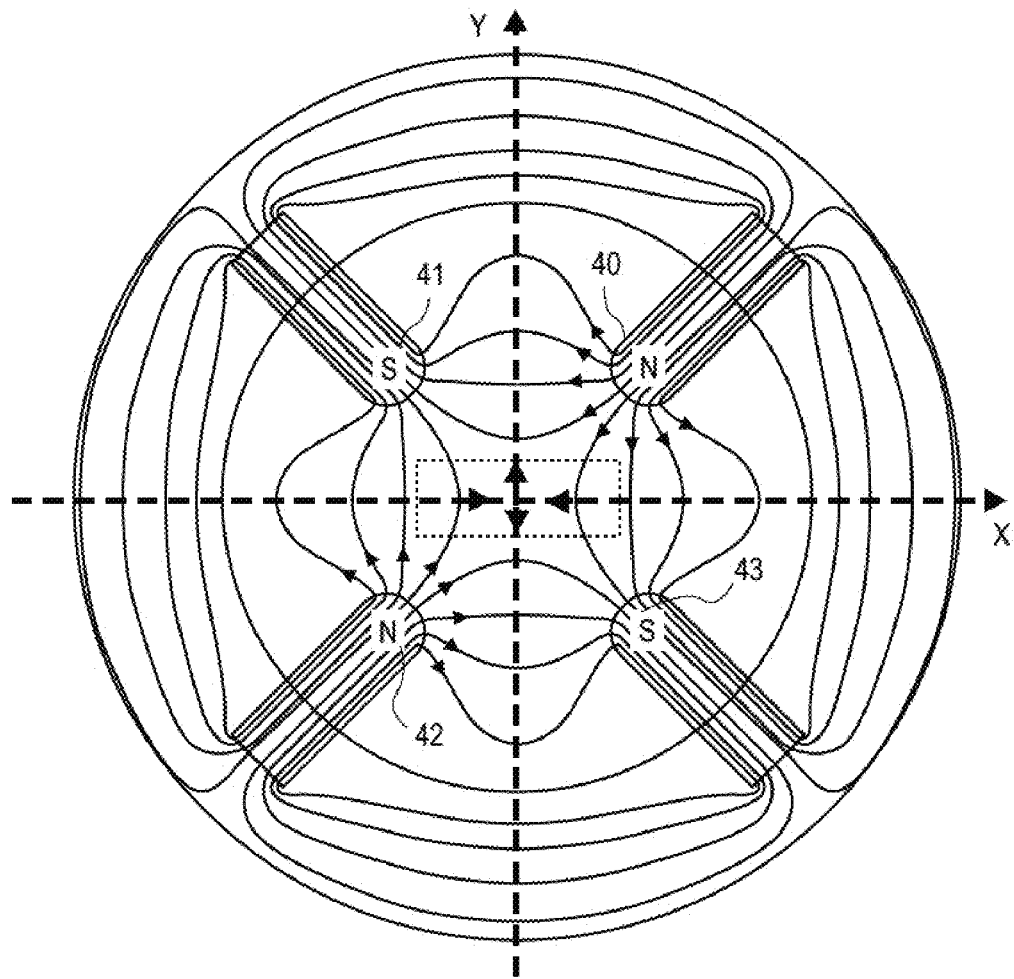
FIGS. 4, 5 and 6 are schematic illustrations respectively of magnetic pole arrangements and magnetic field distributions for quadrupole, hexapole and octopole fields respectively.
Figure 7:
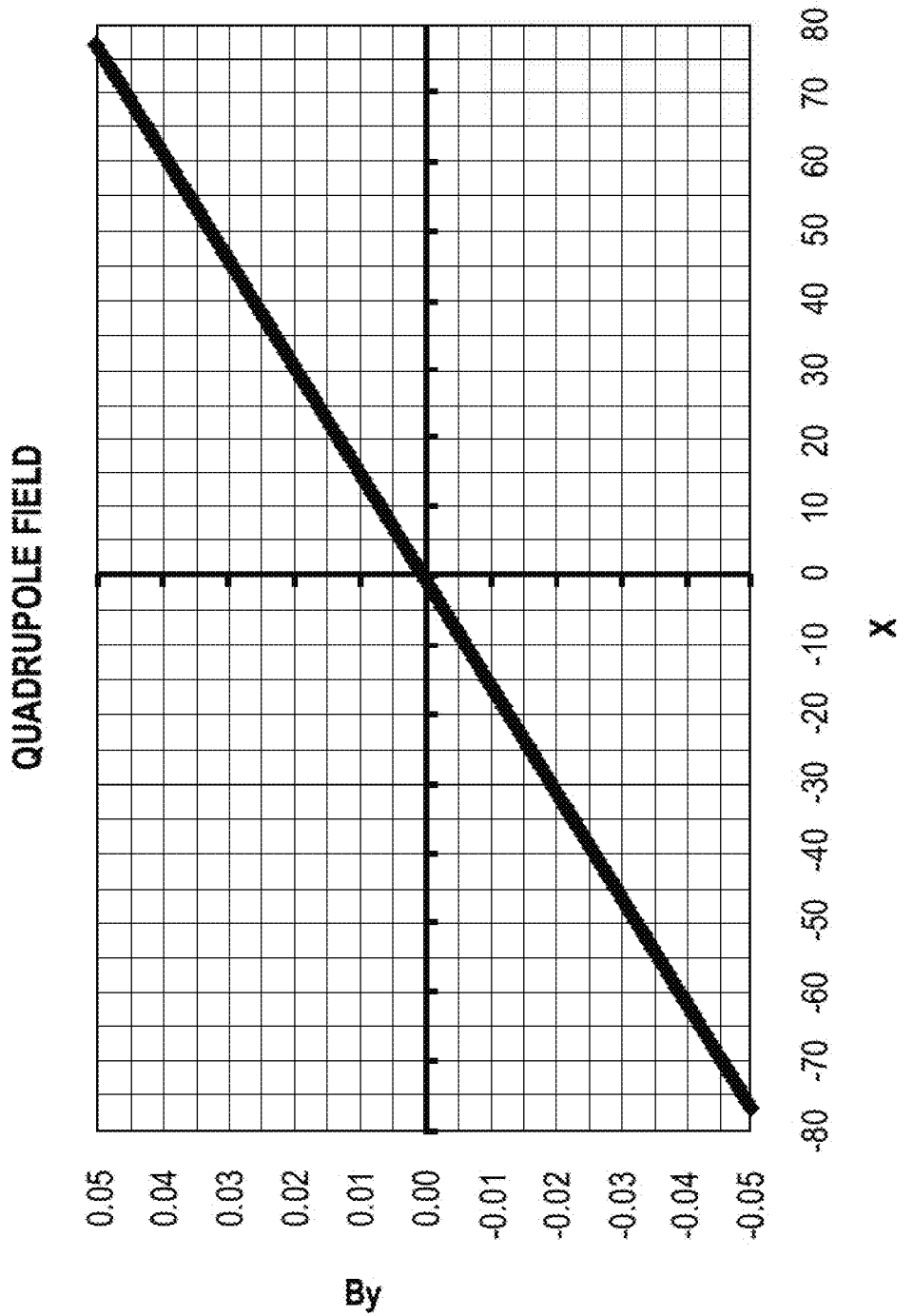
FIGS. 7, 8 and 9 are graphical representations respectively of the magnetic fields in a central region along an x-axis as illustrated in each of FIGS. 4, 5 and 6.

This quadrupolar component magnetic field distribution, produced by energizing the first coil structures 27 and 28, can be better understood with reference to FIGS. 4 and 7. FIG. 4 illustrates a classic quadrupolar arrangement with four magnetic poles 40-43 as illustrated, on an X-Y co-ordinate system. Considering only a central region extending along the X-axis, it can be seen that the magnetic field in the Y direction varies along the X-axis linearly, as illustrated in FIG. 7. Accordingly, for a ribbon-shaped ion beam having a cross-section with a long dimension in the X-direction, and a much shorter dimension in the Y direction, the quadrupolar field structure of FIG. 4 closely corresponds to a distribution of magnetic field strength extending dominantly in the Y direction, but varying linearly with X. This is the magnetic field distribution formed in the elongate space 26 between the ferromagnetic bars 24 and 25, by the uniformly wound coil structures 27 and 28, selectively energized as described above.

Figure 10A:
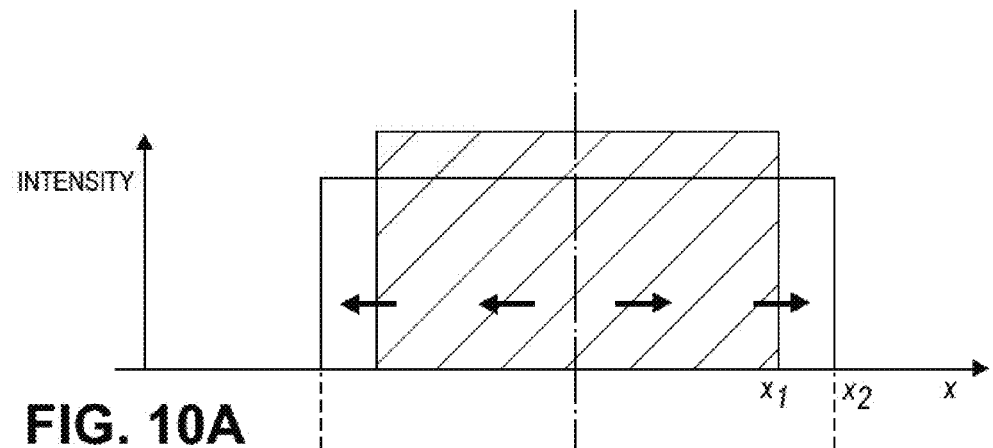
FIGS. 10A, 10B and 10C are graphical representations of the effect on the beam density distribution in the x-direction of the ribbon beam produced by correcting magnetic fields respectively of quadrupole, hexapole and octopole form.

The effect on ribbon beam 12 of the quadrupolar distribution of field intensity along the x-direction as illustrated in FIG. 7 is shown in FIG. 10A. A quadrupole distribution of y direction field along the x-direction of the ribbon beam has the effect of expanding or contracting the long dimension of the ribbon beam cross-section, that is the extent of the beam in the x-direction. If the field intensity distribution goes through zero at a center line of the ribbon beam, as shown in FIG. 7, then the x-dimension of the ribbon beam is expanded or contracted, symmetrically, without any overall deflection of the beam in the x-direction. In the illustration of FIG. 10, an idealized ribbon beam is illustrated having a uniform intensity over a distance $2x_1$. Application of the quadrupole field intensity distribution has the effect of spreading this ribbon beam so as to have a reduced uniform intensity over a larger distance $2x_2$. Reversing the current flows in the coil structures 27 and 28 would have the reverse effect on the ribbon beam.

Referring again to FIG. 2B, as mentioned previously, the second coil structures 33 and 34 are also wound on the bars 24 and 25 respectively. In FIG. 2B, these coil structures have been drawn schematically to illustrate the winding direction of the turns of the coil structures. As can be seen, the upper coil structure 33, wound on the ferromagnetic bar 24 is wound in the opposite direction on either side of a central point 45 of the coil structure located at the mid-point of the bars 24 and 25. Thus, a left hand part 46 of the coil structure 33 is wound with a first turns direction, and a right hand part 47 of the coil structure 33 is wound with a second turns direction. Also, the representation of each of the coil structures 33 and 34 in FIG. 2B shows that the number of turns per unit length varies along the length of the bars 24 and 25, with x. There are most turns per unit length near a first end 48 of the coil structure 33 at a first end 29 of the bar 24, progressively fewer coils per unit length towards the center point 45 of the coil structure 33, at the middle of the bar 24 (x=0), and then an increasing number of turns again, of opposite hand, proceeding towards a second end 49 of the coil structure 33 at the corresponding end 30 of the bar 24. The coil structure 34 on the opposed ferromagnetic bar 25 has a structure which matches that of the coil structure 33, with the same variation of turns per unit length along the length of the coil structure 34. However, in the example illustrated in FIG. 2B, the turns of the coil structure 34 have the opposite hand to the corresponding turns of the coil structure 33. Then, when the two coil structures 33 and 34 are energized by electric currents flowing in the same direction along the length of the continuous windings of the coil structures 33 and 34, as illustrated by arrows 50, opposed magnetic poles are formed at corresponding ends of the coil structures. In the illustrated example, a South pole is shown formed at the end 48 of the coil structure 33 and a North pole is shown at an end 51 of the coil structure 34. The reversal of the winding direction of the turns of the coil structures 33 and 34 at the center point of the structures produces a North pole at the center point 45, and a South pole at a center point 52 of the lower coil structure 34. A South pole is formed at the right hand end 49 of the coil structure 33, and a North pole at the corresponding end 53 of the lower coil structure 34.

In summary, the second coil structure 33 on the uppermost ferromagnetic bar 24, has a continuous winding forming the left hand part 46 of the coil structure between the left hand end 48 and the center point 45 at a mid-point of the bar. The second coil structure 34 on the lower ferromagnetic bar 25 also has a continuous winding extending from a left hand end 51 of the structure 34 to a center point 52. These two continuous windings of the second coil structures 33 and 34 each have a predetermined distribution along the length of the respective bar, of turns per unit length. In the example of FIG. 2B, each of the coil structures 33 and 34 also have a second continuous winding extending between the center points 45 and 52 of the structures 33 and 34 to right hand ends 49, 53. These further continuous windings may have turns per unit length along the bar which vary as a mirror image of the left hand parts of the coil structures. In this example, the left and right hands parts 46 and 47 of the coil structure 33 are connected together at the center point 45, and the corresponding left and right hand parts of the coil structure 34 are connected together at the center point 52.

In the example of FIG. 2B, the turns per unit length of the continuous windings of the coil structures 33 and 34 vary linearly from a minimum value at the center points 45 and 52 of the structures, to maximum values at the ends 48, 49 and 51, 53 of the structures. This predetermined distribution of coils per unit length along the bars 24 and 25, provided by the second coil structures 33 and 34, is effected to produce, when the coils are appropriately energized as illustrated in FIG. 2B, a second magnetic field component in the y direction across the elongate space 26 between the bars 24 and 25, this second magnetic field component having a hexapole distribution in the x-direction, of magnetic field intensity.

Figure 5:
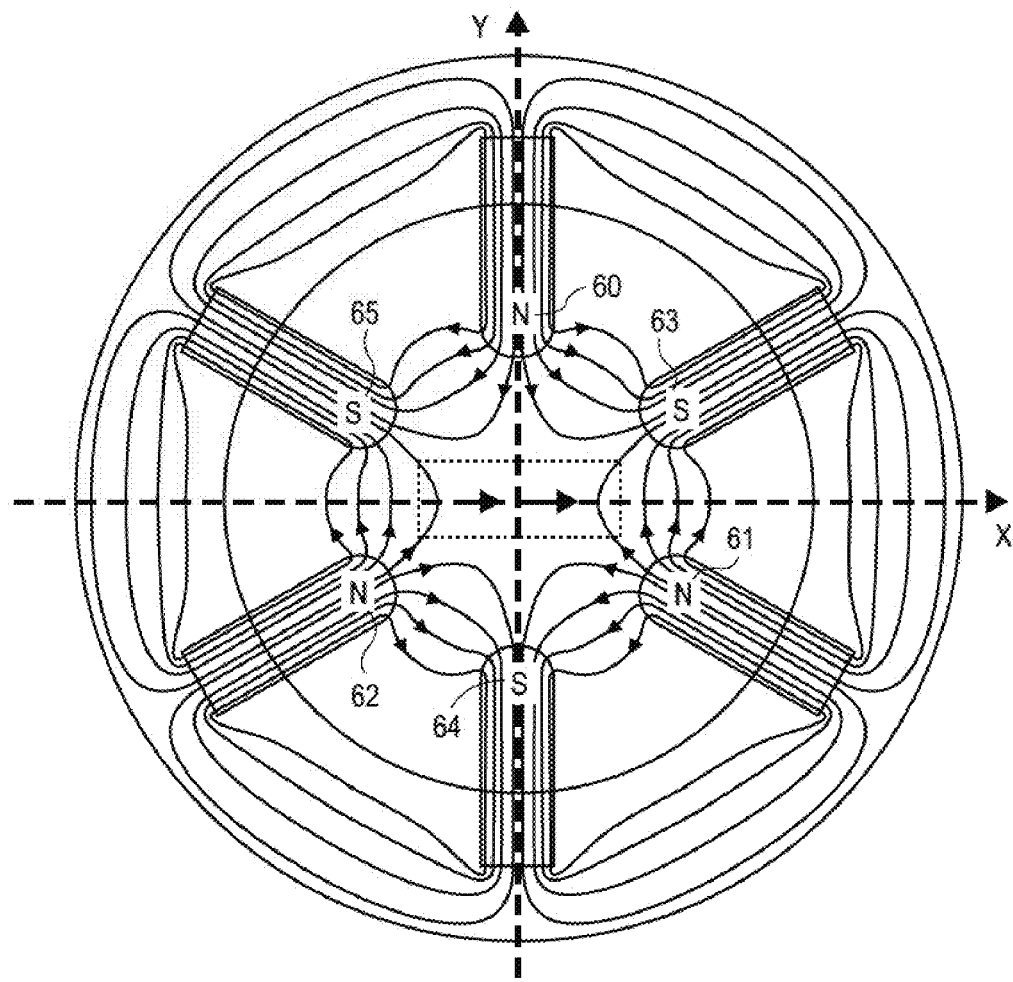

FIG. 5 provides an illustration of a characteristic hexapole magnetic field distribution, generated by six symmetrically distributed magnetic poles, comprising three North poles 60, 61 and 62 and three South poles 63, 64 and 65. Considering only an elongate region close to an X-axis of the pole structure of FIG. 5, the magnetic field close to the X-axis extends generally in the Y direction and has an intensity distribution which varies with X substantially as illustrated in FIG. 8

Figure 8:
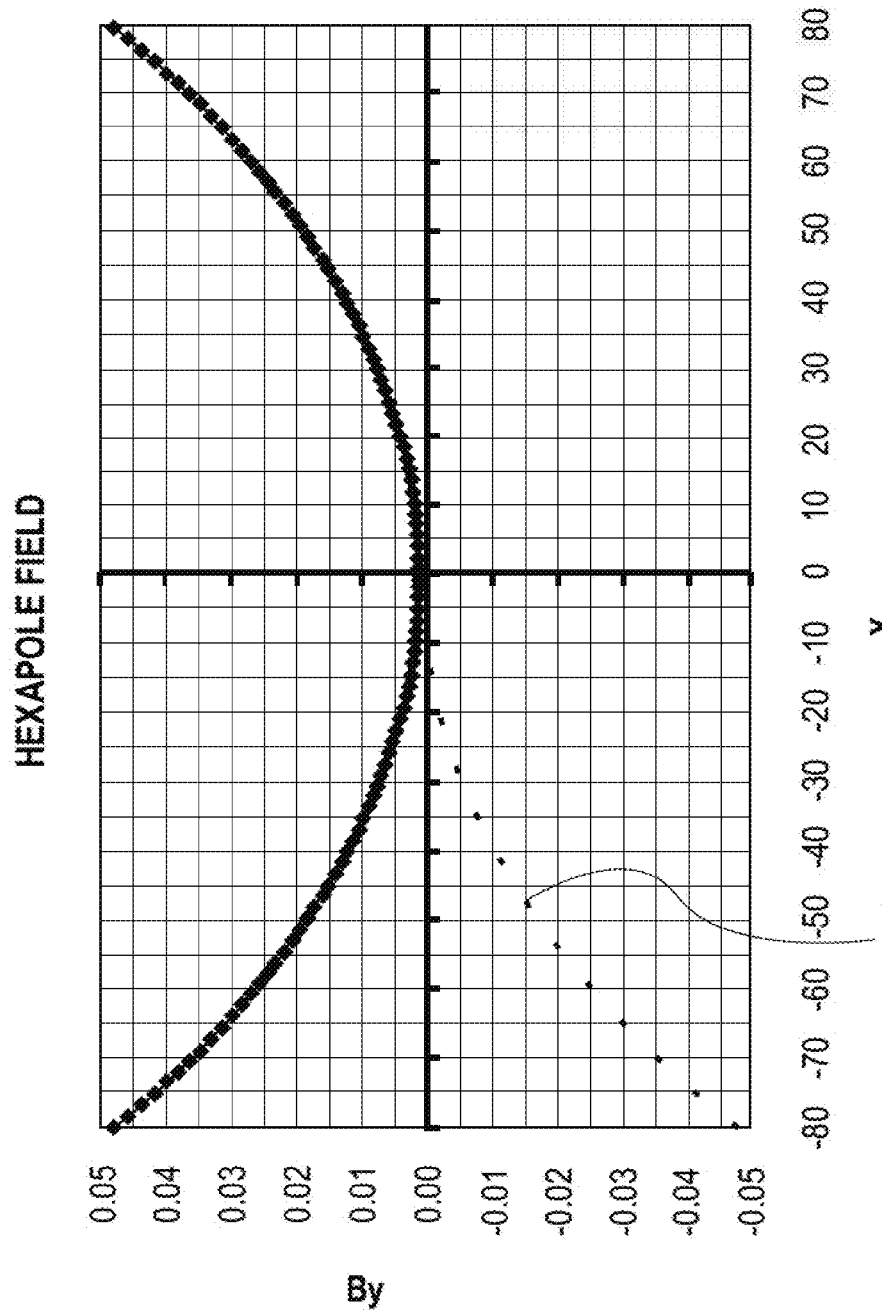
Figure 10B:
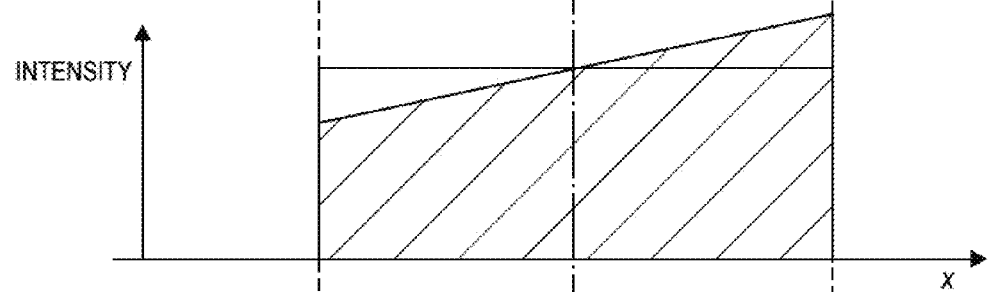

FIG. 10B illustrates the effect of the hexapole field of FIG. 8 on the ribbon beam 12 passing between the bars 24 and 25. Ions at the center of the ribbon beam (x=0) see a y direction magnetic field which is substantially zero and are therefore not deflected. On the other hand, ions to one side of the ribbon beam are deflected into the center of the ribbon, and ions on the other side of the ribbon beam are deflected away from the center, producing at a position downstream of the beam modifying structure, an intensity variation across the width of the ribbon (in the x-direction) as illustrated in FIG. 10B. Additional adjustment of the dipole component of magnetic field between the bars 24 and 25 may be required to recenter the beam in the x-direction, and further compensatory adjustment of the quadrupole field, described above, may be required to re-establish the correct width of the ribbon beam. The dipole component of magnetic field between the ferromagnetic bars 24 and 25 may be adjusted by various means which will be described later.

In general, by selectively energizing the first coil structures 27 and 28 on the ferromagnetic bars 24 and 25, and also the second coil structures 33 and 34 on the bars, a ribbon-shaped beam such as beam 12 passing between the bars 24 and 25 can be modified. Where the first and second coil structures on the bars 24 and 25 have continuous windings which vary along the length of the bar, such as to provide quadrupole and hexapole magnetic field components respectively between the bars 24 and 25, the intensity of the ribbon-shaped beam across the width of the beam (in the x-direction) can be modified, both to control the overall width of the beam in the long direction of the beam cross-section (the x-direction) and also to provide compensation where the ribbon-shaped beam has an intensity which is somewhat asymmetrical over the width of the ribbon in the x-direction.

Figure 2C:
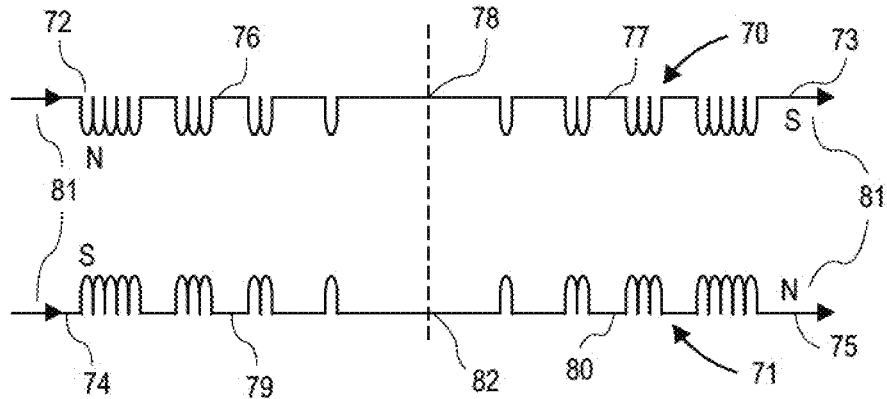

FIG. 2C illustrates third coil structures 70 and 71, also wound additionally on the ferromagnetic bars 24 and 25 respectively. The coil structures 70 and 71 have continuous windings extending between respective ends 72, 73 and 74, 75 of the structures 70 and 71. A left hand part 76 of structure 70 is wound with the same hand as a right hand part 77 on the opposite side of a center point 78 located at a mid-point of the bar 24 (x=0). Similarly, a left hand part 79 of the structure 71 is wound with the same hand as a right hand part 80. However, in the illustrated example of FIG. 2C, the lower structure 71 on the lower ferromagnetic bar 25 is wound with the opposite hand compared to the upper structure 70 on the upper bar 24, so that when the two structures 70 and 71 are energized with electric currents flowing along the windings in the same direction from one end to the other, as illustrated by arrows 81, opposed North and South poles are formed between the juxtaposed ends of the ferromagnetic bars 24 and 25 as illustrated.

Each of the left and right hand parts 76 and 77 of the upper coil structure 70 comprises a continuous winding extending between a respective end 72, 73 of the structure 70 and the center point 78 of the structure. Similarly, each of the left and right parts 79 and 80 of the lower third coil structure 71 comprises a continuous winding extending from respective left and right ends 74, 75 and a center point 82 of the structure 71. As shown in FIG. 2C, each of the continuous windings of the coil structures 70 and 71 is formed with a third distribution of turns per unit length. This third distribution of turns per unit length for the third coil structures is different from the second distribution of turns per unit length of the second coil structures of FIG. 2B, and the first distribution of turns per unit length of the first coil structures of FIG. 2A.

Figure 6:
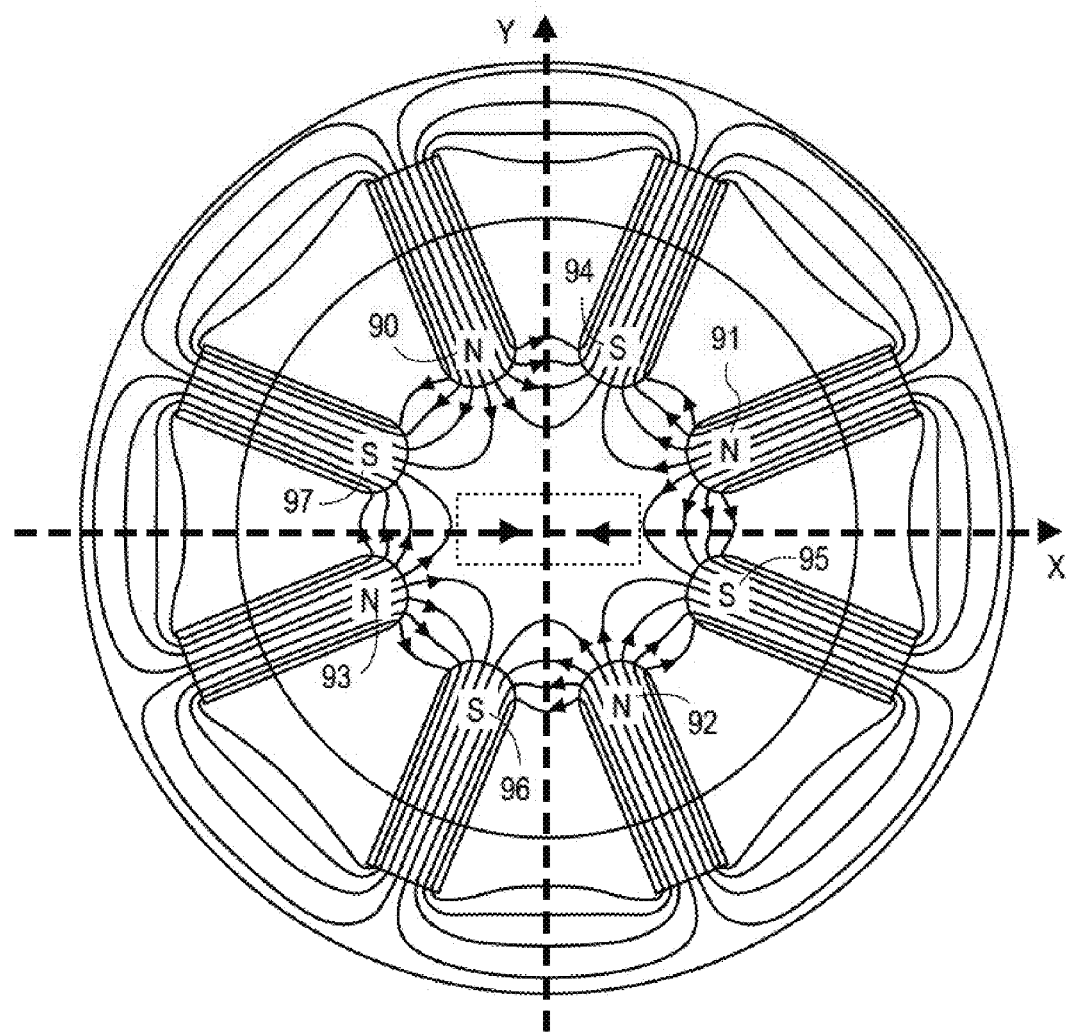
Figure 9:
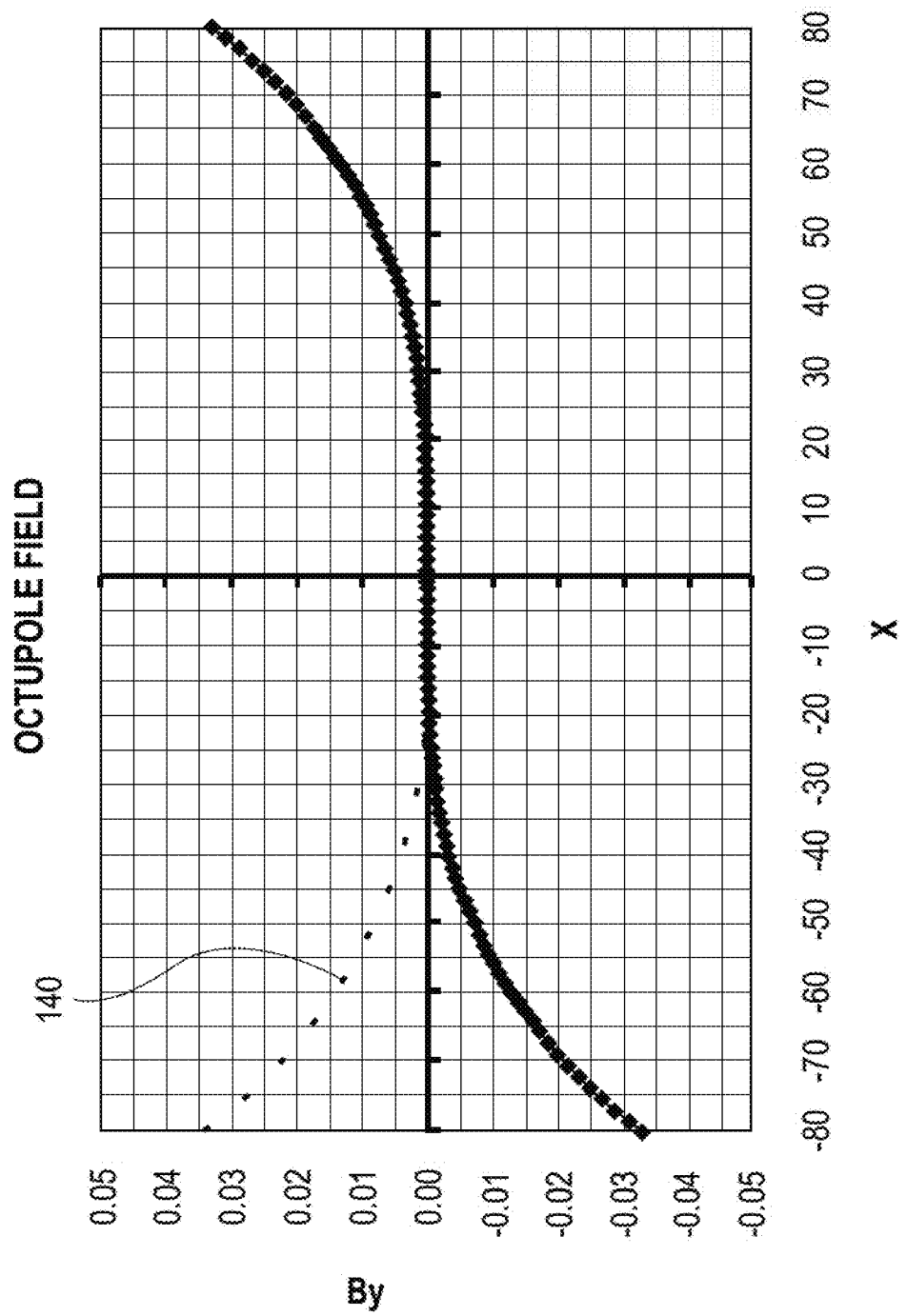
Figure 10C:
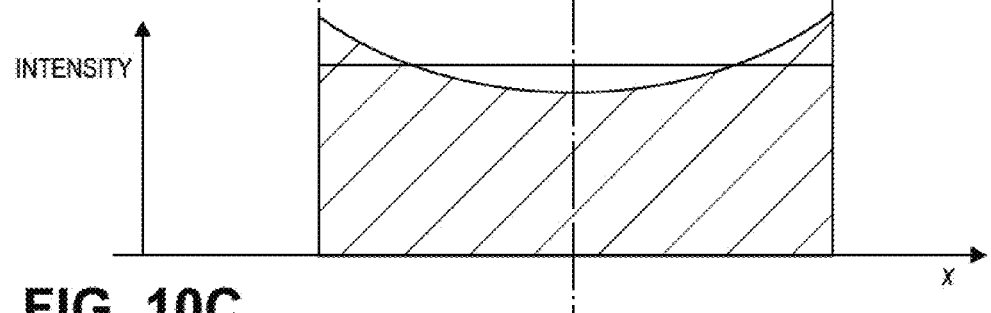

In this example, the third distribution of turns per unit length provided by the third coil structures is such as to produce an octopole distribution along the x-direction of magnetic field extending in the y direction. FIG. 6 shows a typical octopole magnetic field distribution generated by eight magnetic poles distributed on an X-Y Cartesian coordinate system. Thus, four North poles 90, 91, 92 and 93 are distributed alternating with four South poles 94, 95, 96 and 97 in a symmetrical arrangement as shown. In a region close to the X-axis in the center of the octopole field structure, the magnetic field extends in the y direction and has an intensity variation with X as illustrated in FIG. 9. The effect of a magnetic field component varying along the x-direction as illustrated in FIG. 9, on the ribbon beam 12 passing between the bars 24 and 25 is as illustrated in FIG. 10C. Assuming the left parts 76 and 79 of the coil structures 70 and 71 are symmetrical to the right hand parts 77 and 80, the resulting magnetic field component between the bars 24 and 25 has the effect of symmetrically redistributing beam intensity between the center of the ribbon beam (near x=0) and the outer edges of the ribbon beam. It will be understood that a compensatory adjustment of the quadrupole field component generated by the first coil structures 27 and 28 may be needed to maintain the width of the ribbon beam as desired.

The example described so far with reference in particular to FIGS. 2A, 2B and 2C, illustrate how a ribbon-shaped ion beam which has an elongate cross-section may be modified, using at least first and second coil structures as described on opposed ferromagnetic bars, selectively energized to provide respective component magnetic fields extending in the y direction between the bars and having respective first and second distributions of magnetic field intensity with x along the elongate space between the bars. In the examples, first, second and third coil structures are described which can provide quadrupole, hexapole and octopole distributions of magnetic field intensity. One or more further coil structures may also be provided to enable a corresponding additional magnetic field component to be formed having an additional distribution of field intensity. For example, a fourth coil structure may be provided on each of the bars 24 and 25 with the coil structures having continuous windings with a fourth distribution of coils per unit length, such as to produce a fourth distribution of magnetic field intensity with x along the length of the bars. This fourth distribution of magnetic field intensity may be a decapole distribution.

Figure 3A:
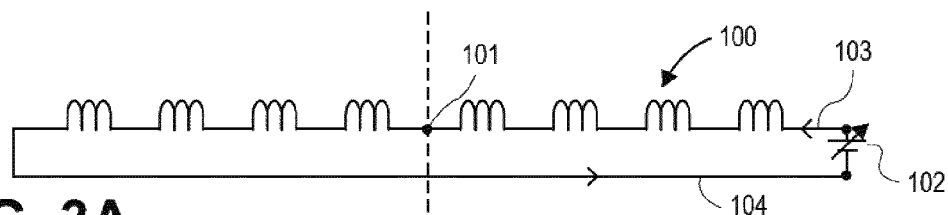
FIGS. 3A, 3B, 3C and 3D provide in combination a schematic illustration of the coil structures of a further embodiment of the present invention.

FIGS. 3A, 3B, 3C and 3D illustrate coil structures of an embodiment of beam modifying structure suitable for modifying a ribbon-shaped ion beam of the kind discussed above. FIG. 3A shows a first coil structure 100 on one of a pair of opposed ferromagnetic bars, corresponding to bars 24 and 25 of FIG. 2A. In FIG. 3A, and also each of FIGS. 3B, 3C and 3D, the corresponding coil structure on the second of the two opposed bars is omitted for simplicity. In FIG. 3A, the coil structure 100 is a continuous winding having the same hand over the full length of the coil structure along the length of the bar 24. Thus, the coil structure 100 can be regarded as similar to coil structure 27 in FIG. 2A. The coil structure 100 has a uniform distribution of coils per unit length over the length of the coil structure, and accordingly over the length of the bar 24 and the length of the elongate space 26 between the bars. A center point 101 is defined half way along the coil structure 100 at a mid-point of the respective ferromagnetic bar 24. A programmable power supply unit 102 is connected between power supply leads 103 and 104 connecting to opposite ends of the coil structure 100 to deliver a desired and selected current through the coil structure.

It will be understood that a corresponding coil structure is provided on the other ferromagnetic bar 25. The corresponding coil structure on the other bar 25 may be connected to a separate programmable power supply (not shown) to provide the desired current through the structure. In FIG. 3A, the programmable power supply unit 102 is connected to drive a current through the continuous windings of the coil structure 100 in the direction from right to left in the drawing. If the second corresponding coil structure on the other ferromagnetic bar 25 is wound with the same hand as coil structure 100, then the structure on the other bar 25 should be connected to drive the current through the continuous windings of the structure in the opposite direction, from left to right along the length of the coil structure. With this arrangement, opposed magnetic poles are formed at juxtaposed ends of the two bars, in a fashion similar to FIG. 2A described above. Alternatively, the coil structure on the other ferromagnetic bar 25 could be wound with the opposite hand to the coil structure 100, and the current driven through the coil structure on the other bar 25 in the same direction, from right to left. As will be understood, this arrangement also will produce opposed magnetic poles at juxtaposed ends of the two ferromagnetic bars.

Although the coil structure on the other ferromagnetic bar 25 may be driven from a separate programmable power supply unit, the two coil structures on the two bars 24 and 25 may be connected in series appropriately, so that a single power supply can drive the same current through the two coil structures.

Figure 3B:
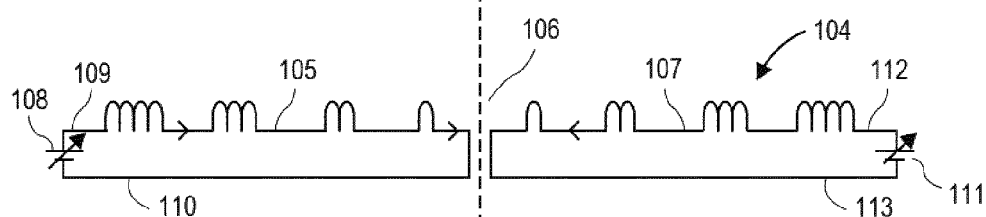

FIG. 3B illustrates a second coil structure 104 on the ferromagnetic bar 24, which is equivalent to the coil structures illustrated in FIG. 2B. However, in FIG. 3B, the second coil structure 104 comprises a first continuous winding 105 on the left hand side of a center line 106 of the coil structure, which corresponds to a mid-point of the ferromagnetic bar 24, and a further continuous winding 107 on the right hand side of the center line 106. Each of the continuous windings 105 and 107 extends from the center line 106 to a respective end of the coil structure at a corresponding end 29 and 30 of the ferromagnetic bar 24. Importantly, the continuous winding 105 is connected to a first programmable power supply unit 108 via a pair of power supply leads 109 and 110, and the continuous winding 107 is connected to a separate programmable power supply unit 111, via a pair of power supply leads 112 and 113.

In this embodiment, each of the continuous windings 105 and 107 has a distribution of coils per unit length which varies linearly from a maximum at the respective end of the coil structure 104, to a minimum at the center line 106 of the coil structure. The two continuous windings 105 and 107 are wound with the same hand, but the power supply units 108 and 111 are connected to drive currents through the two windings 105 and 107 in opposite directions along the length of the coil structure 104, from the ends towards the center line 106 in this illustration. As will be understood by the skilled person, if the two continuous windings 105 and 107 have the same values of turns per unit length at corresponding positions between each end of the coil structure 104 and the center line 106, and the power supplies 108 and 111 are arranged to drive the same value of current through the two continuous windings, then the magnetic effect of the coil structure 104 is identical to that of the coil structure 33 in FIG. 2B.

Again, a similar second coil structure is provided on the other ferromagnetic bar 25, but, for simplicity, this has not been illustrated in FIG. 3B.

It can be seen, therefore, that coil structures as illustrated in FIG. 3B on the two ferromagnetic bars 24 and 25 can produce a magnetic field in the elongate space between the bars which has an intensity varying according to a hexapole distribution, in the same manner as the coil structures illustrated in FIG. 2B above.

If, as mentioned above, the continuous windings 105 and 107 of each of the coil structures 104 are similar, and symmetrical about the center line, and also driven with the same current, then the field component generated between the ferromagnetic bars 24 and 25 may have the symmetrical distribution as illustrated in FIG. 8. However, because the two parts, windings 105 and 107, of each of the second coil structures 104 are connected separately by respective power supply leads to independent programmable power supplies 108 and 109, different currents may be driven through the two windings 105 and 107. In this way, the intensity distribution of the component field produced by the second coil structures may become non-symmetrical about the center line (x=0). In the extreme, zero current passing through one of the two continuous windings 105 and 107 would result in the field component to one side of the center line (x=0) becoming non-varying with x. Reversing the current direction in one of the continuous windings 105 and 107 would produce a field which varies with reverse polarity to one side of the center line, for example as shown by the dotted line 120 in FIG. 8.

Importantly, in order to ensure that the second coil structures 104 produce magnetic field components extending in the y direction, across the thickness of the ribbon beam between the bars, corresponding currents should be provided by the power supplies 108 and 111 in the second coil structures on each of the two ferromagnetic bars 24 and 25. This could be ensured by connecting the continuous winding 105 on the ferromagnetic bar 24 in series with the corresponding continuous winding of the second coil structure on the other ferromagnetic bar 25, with the two windings then being powered from a common power supply 108. Similarly, the continuous windings 107 on the two ferromagnetic bars may be connected in series to a single common power supply 111. However, separate power supplies corresponding to power supplies 108 and 111 may be provided for the continuous windings of the second coil structure on the lower ferromagnetic bar 25. These power supplies would then be operated to provide corresponding currents in order to produce the desired y direction magnetic field components between the bars.

Figure 3C:
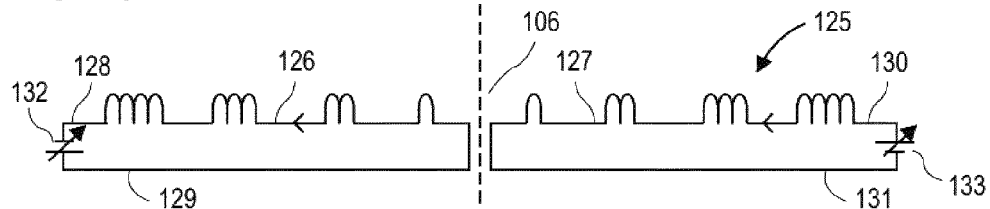

FIG. 3C illustrates a third coil structure 125 on the ferromagnetic bar 24. This third coil structure may have the same variation in turns per unit length as the structure described above with respect to FIG. 2C, so that corresponding third coil structures 125 on the two ferromagnetic bars 24 and 25 can produce a component magnetic field with an octopole intensity variation along the length of the elongate space between the bars. However, in FIG. 3C, each of the coil structures 125 is divided into a first continuous winding 126 to the left of the center line 106, and a second continuous winding 127 to the right of the center line 106. As with the second coil structures, each of the continuous windings 126 and 127 of the third coil structure 125 is connected by respective power supply leads 128, 129 and 130, 131 to respective programmable power supply units 132 and 133. In FIG. 3C, the two continuous windings 126 and 127 of the third coil structure 125 are wound with the same hand, and the power supply units 132 and 133 are shown connected to drive currents through these continuous windings 126 and 127 in the same direction along the length of the coil structure 125. If the two continuous windings 126 and 127 have the same numbers of turns per unit length at corresponding positions between the ends of the coil structure and the center line 106, and the power supply units 132 and 133 are controlled to drive the same currents through the windings 126 and 127, then the coil structure 125 produces the same component field distribution as the coil structures illustrated in FIG. 2C described above. It will be understood that the corresponding third coil structure is provided on the lower ferromagnetic bar 25 and the third coil structures on the two bars 24 and 25 are wound and driven to produce opposed magnetic poles at the ends of the coil structures, at corresponding juxtaposed ends of the bars, in the same way as FIG. 2C. Thus the third coil structures of FIG. 3C can produce a magnetic field component extending in the y direction having an intensity distribution in the x-direction as illustrated in FIG. 9.

However, because each of the third coil structures 125 is formed of the two continuous windings 126 and 127 which are independently powered from respective power supply units 132 and 133, the two sides of the magnetic field distribution shown in FIG. 9, either side of x=0, can be made asymmetric. For example, if the current through one of the continuous windings 126 and 127 is reversed, a magnetic field intensity distribution on that side of the center line may be generated similarly with reverse polarity, as illustrated by the dotted line 140 in FIG. 9.

Figure 3D:
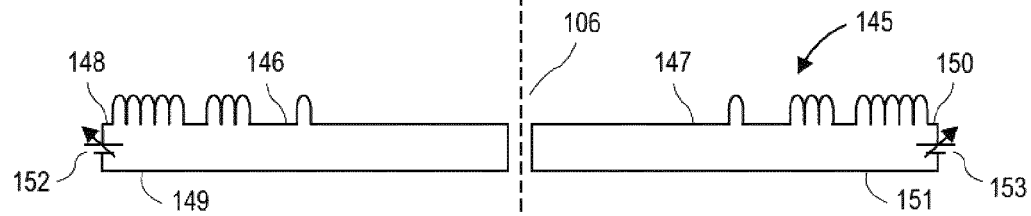

FIG. 3D illustrates a fourth coil structure 145 formed by two continuous windings 146 and 147 on opposite sides of the center line 106. Again each of the continuous windings 146 and 147 is connected by respective pairs 148, 149 and 150, 151 of power supply leads to respective programmable power supply units 152 and 153. Each of the continuous windings 146 and 147 has a fourth distribution of coils per unit length along the length of the fourth coil structure 145, and correspondingly of the ferromagnetic bar 24. This fourth distribution of turns per unit length is different from the first, second and third distributions of the first, second and third coil structures illustrated in FIGS. 3A, 3B and 3C. As with FIGS. 3B and 3C, a corresponding fourth coil structure is also formed on the lower ferromagnetic bar 25. The fourth distribution of coils per unit length is selected so that the fourth coil structures on the two ferromagnetic bars 24 and 25, when energized with currents through the continuous windings 146 and 147 as illustrated, provides a component magnetic field extending in the y direction between the bars 24 and 25 which has an intensity distribution along the length of the elongate space 26 between the bars, corresponding to a decapole distribution. It will be understood by the skilled person that a decapole distribution has, in a region close to an x-axis, a distribution similar to the hexapole distribution illustrated in FIG. 8, except that the curve is flattened in the center on either side of x=0 and rises with an increased gradient towards the outer ends of the coil structure.

A decapole field distribution as provided by the fourth coil structures 145 and FIG. 3D, can be used to redistribute beam ions near the edges of the ribbon beam. As with the second and third coil structures described with reference to FIGS. 3B and 3C, the fourth coil structures 145 on the two ferromagnetic bars 24 and 25 can be energized by currents from power supplies 152 and 153 to provide a symmetrical correction either side of the center line of the ribbon beam. However, because each of the coil structures 145 comprises separately energized continuous windings 146 and 147, asymmetric correction is also possible as required.

Figure 11:
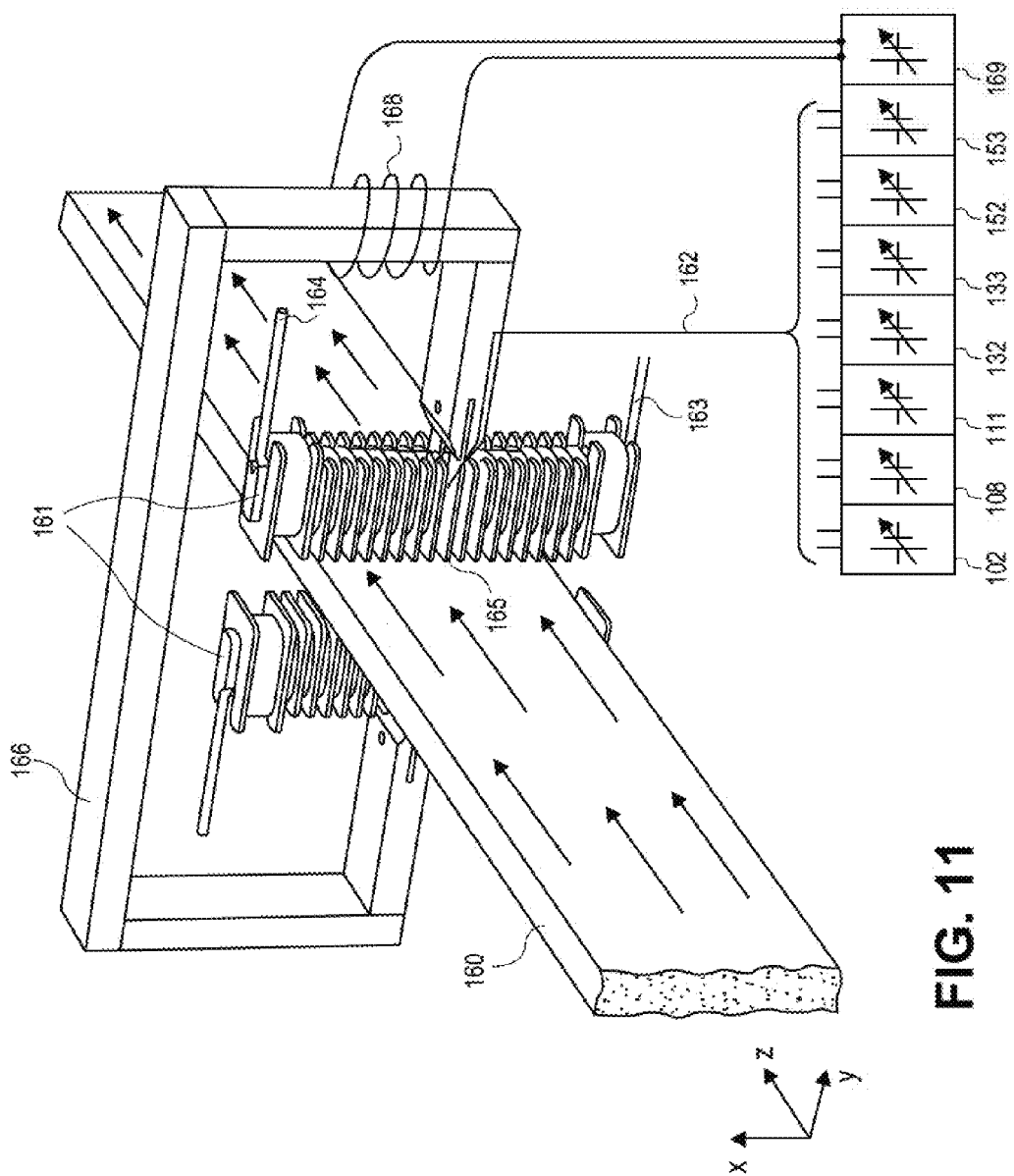
FIG. 11 is a perspective view of a ribbon beam modifying structure embodying the present invention.

FIG. 11 illustrates an embodiment of beam modifying structure in greater detail. In the Figure, a ribbon-shaped ion beam 160 passes between opposed ferromagnetic bars 161. The ferromagnetic bars 161 each carry first, second, third and fourth coil structures as illustrated and described above with reference to FIGS. 3A-3D. Power supply leads to the continuous windings of the first, second, third and fourth coil structures are shown schematically at 162, connecting the continuous windings to the programmable power supply units 102, 108, 111, 132, 133, 152 and 153. A corresponding set of power supply leads may be used to connect the power supply units to the first, second, third and fourth coil structures on the other ferromagnetic bar 161 on the far side of the ion beam 160 as illustrated. These additional power supply leads are omitted in the drawing for simplicity. The coil structures on the two ferromagnetic bars 161 may be driven from separate sets of power supply units, or may be connected together, for example in series, so that corresponding continuous windings of corresponding coil structures on the two bars 161 can be driven from the same power supply unit.

The windings of the first, second, third and fourth coil distributions are provided one over the other on the respective ferromagnetic bars 161. The bars 161 are of steel (or other ferromagnetic material) and selected to have sufficient cross-section to ensure minimal magnetic saturation along each bar. In this way, the different coil structures can be energized simultaneously, allowing superposition of the respective magnetic field distributions generated by the structures. In the previously discussed examples, where the coil structures on the two bars 161 are energized to produce mirror symmetrical distributions of magnetostatic potential along the length of the bars 161, a magnetic field extending in the y direction across the thickness of the ribbon beam 160 is generated. The different multipolar distributions over the x-direction of the magnetic field intensities produced by the different coil structures, are generated additively, so that a complex overall correction can be applied to the ribbon beam.

In FIG. 11, the ferromagnetic bars 161 and the coil structures thereon are water cooled by cooling water flowing through conduits 163 and 164.

Mid-points 165 of each of the two ferromagnetic bars 161 are magnetically interconnected by a yoke structure 166, which is effective for controlling a dipole component of magnetic field intensity in the y direction across the elongate open space between the two bars 161. In the absence of any magnetostatic potential applied along the ferromagnetic yoke structure 166, the structure is effective to equalize the magnetostatic potential at the mid-points 165 of the two bars 161. This has the effect of removing the North and South poles at the center points 45 and 52 of the second coil structures 33 and 34 illustrated in FIGS. 2B and 3B. As a result, the hexapole field distribution illustrated in FIG. 8 may be produced between the two bars. Similarly, the decapole field distribution produced by the fourth coil structure of FIG. 3D can be modified by the ferromagnetic yoke 166 to produce a zero magnetic field in the y direction at the mid-points of the bars 161.

If a variation of the overall dipole field between the two bars 161 is required, this may be produced by driving a selected current through a coil 168 on the ferromagnetic yoke 166, from a further programmable power supply unit 169. A dipole field between the two bars 161 may be desirable to ensure control of the direction of the ion beam in the plane of the ribbon.

Figure 12:
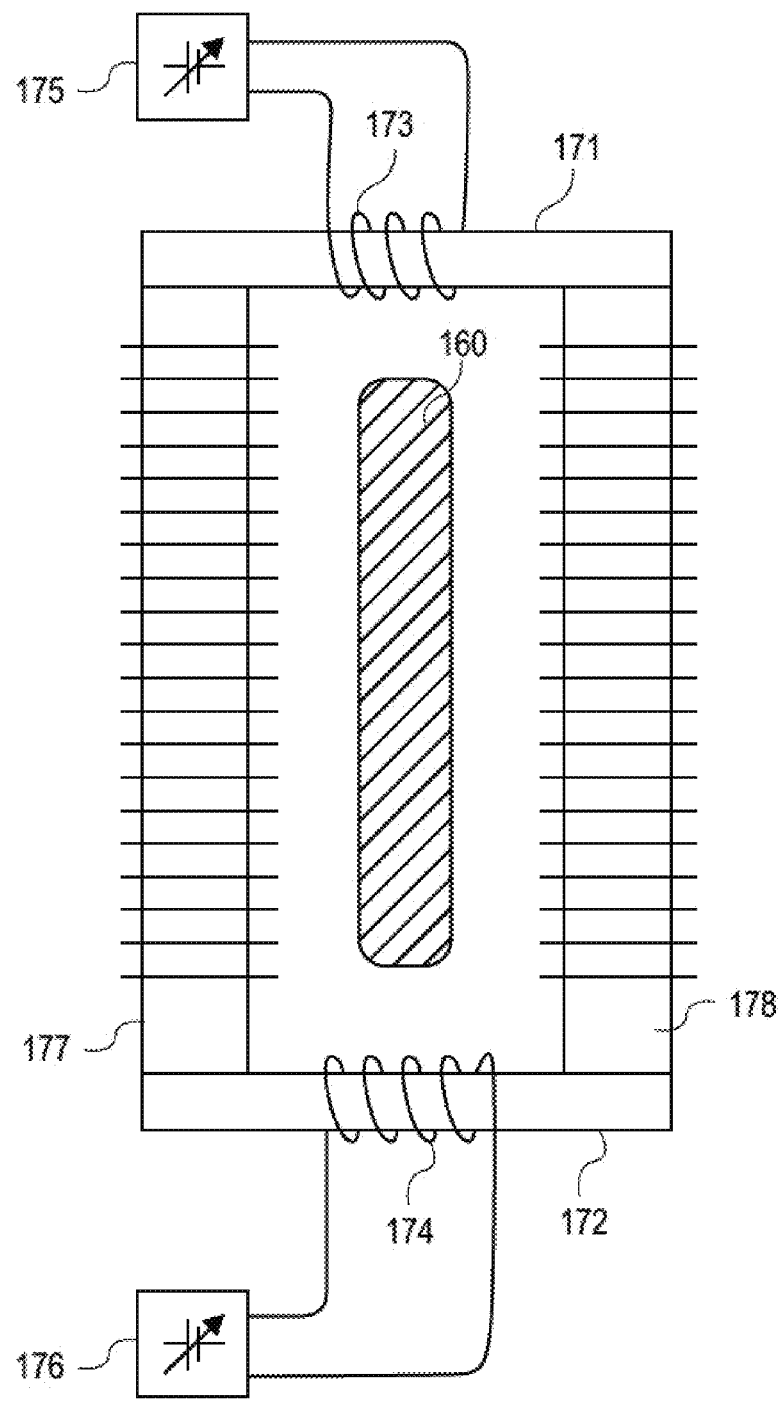
FIG. 12 is a plan view of an alternative magnetic frame structure which may be used instead of the structure illustrated in FIG. 11.

As illustrated in FIG. 12, instead of the single yoke 166 interconnecting mid-points of the two bars 161, juxtaposed ends of the two opposed ferromagnetic bars, shown in FIG. 12 as 177 and 178, may be magnetically interconnected by a pair of ferromagnetic core pieces 171 and 172. Respective bucking coils 173 and 174 are wound on each of the core pieces 171 and 172, connected to programmable power supplies 175 and 176 respectively. By applying appropriate currents to the bucking coils 173 and 174 on the core pieces 171 and 172, appropriate magnetic potentials can be maintained between juxtaposed ends of the ferromagnetic bars and magnetic short circuits avoided.

Other arrangements may be contemplated for controlling the magnetostatic potentials at the ends of the bars 177 and 178.

Figure 13:
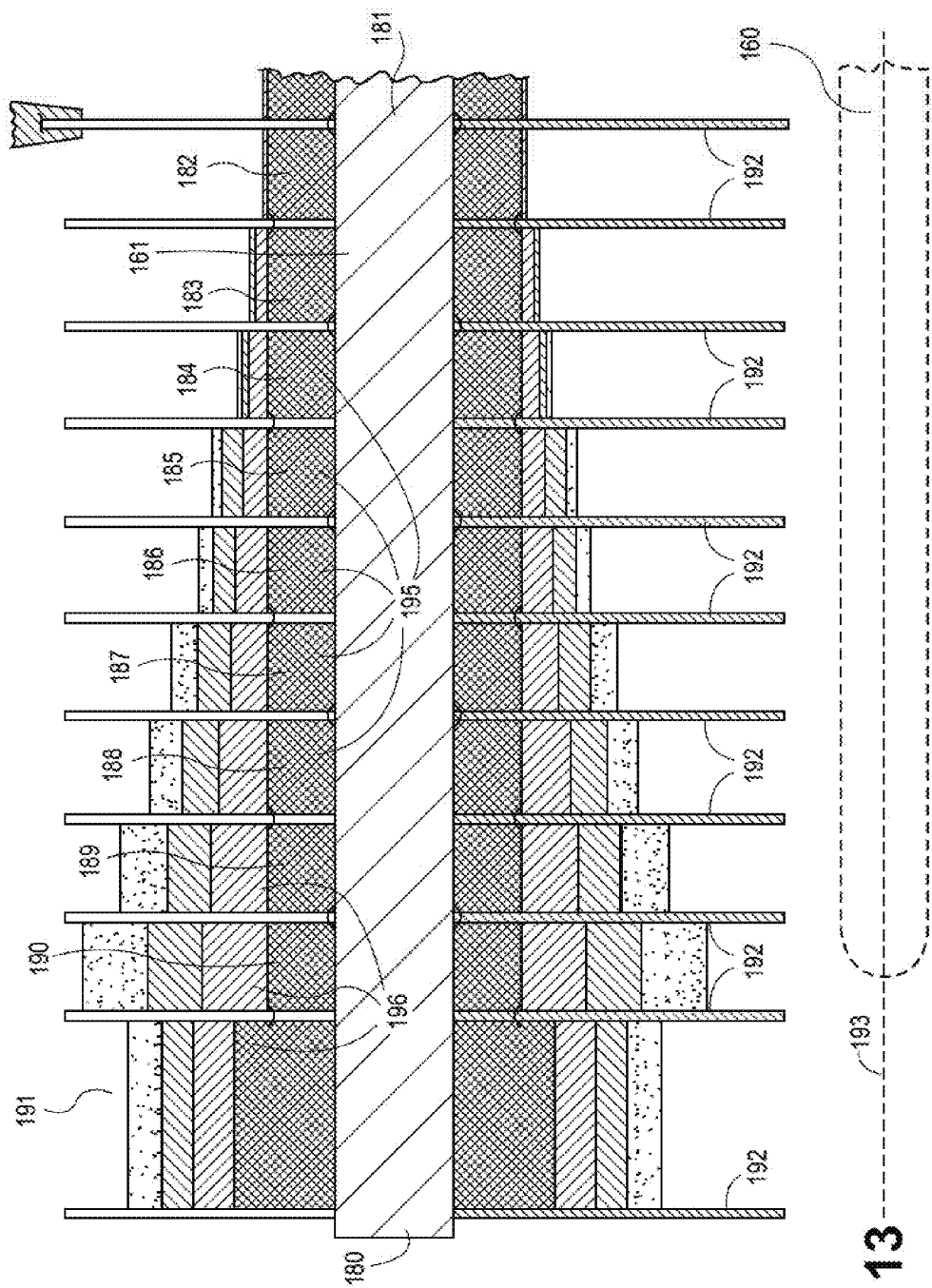
FIG. 13 is a detailed schematic illustration of part of the ribbon beam modifying structure of FIG. 11.

The detailed construction of one of the ferromagnetic bars 161 of FIG. 11, together with the manner of forming the desired coil structures on the bar, is illustrated in FIG. 13. In this Figure, for clarity one half of one ferromagnetic bar 161 is illustrated, between an end 180 and a mid-point 181. In the orientation of FIG. 13, a left hand end of the bar is illustrated, and the right hand side of the bar will be the mirror image of the half of the bar shown.

The bar 161 carries a number of coil units, 182, 183, etc. up to 191 respectively. There are thus ten coil units stacked adjacent one another between the mid-point 181 and the illustrated end 180 of the bar 161. A corresponding number of coil units are stacked on the other end of the bar 161 to the right of the mid-point 181, forming a mirror image of the illustrated coil units. There are thus always an even number of coil units on the bar 161 as a whole, evenly distributed on either side of the mid-point 181 of the bar. Each of the coil units 182, 183 etc is separated by a ferromagnetic tab 192 and a further tab 192 is mounted at the outer edge of the end-most coil unit 191 at the end 180 of the bar. The magnetic tabs 192 between adjacent coil units ensure that the appropriate magnetostatic potential at that point along the length of the bar 161 is provided along the edges of the elongate space between the bars as near as possible to the line 193 of a plane of symmetry between the two bars 161, while allowing sufficient space to accommodate the thickness (in y) of the ribbon beam.

The individual coil units 182, 183 up to the last but one coil unit 190 approaching the end 180 of the bar have a uniform dimension along the length of the bar. The final coil unit 191 at the end 180 of the bar has twice this length dimension. Turns of the first, second, third and fourth coil structures are then provided in each of the first nine coil units 182 to 190, with the number of turns in each of these nine coil units varying so as to provide the required distribution along the length of the bar of turns per unit length of the respective coil structure.

The first coil structure is illustrated by the parts 195 lying next to the bar 161, of each of the coil units 182-190. The number of turns in each of the parts 195 which together form the first coil structure, is the same in each of the coil units 182-190. As a result, it can be seen that the parts 195 of the coil units 182-190 together produce said first coil structure with the number of turns per unit length being constant along the length of the bar 161.

A further part 195 in the double length coil unit 191 nearest the end 180 of the bar is wound with opposite hand relative to parts 195 in coil units 182 to 190, and provides termination of the field within the bar so as to reduce aberrations of the desired y-direction fields in the region of the next outermost coil unit 190. The magnetic fields required for modifying the ribbon beam are produced in the space between the bars extending between these outermost-but-one coil units 190 near opposite ends of each bar. Accordingly, the full length of the beam cross-section 160 should be accommodated between these outermost-but-one coil units 190. The part 195 of the double length coil unit 191 is connected in series with the remaining parts 195 of coil units 182 to 190 of the first coil structure and has sufficient turns, in relation to the total number of turns of the rest of the first coil structure to provide reasonable termination of the magnetic field in the bar and reduce aberrations as aforesaid. The appropriate number of turns for coil units 191 can be determined empirically.

The second coil structure is represented by parts 196 in each of the coil units 182-190 shown radially outside the parts 195. In the coil units 182-190, having the same length along the bar 161, the number of turns in each of the parts 196 is represented in FIG. 13 by the radial width of the respective part 196. Thus it can be seen that the number of turns in each of the coil units 182-190 increases progressively and linearly towards the end 180 of the bar. As a result, the second coil structure formed by the parts 196 of the coil units has a linearly varying number of turns per unit length along the bar. A further part 196 in the double length coil unit 191 is connected in series with and wound with opposite hand to parts 196 in coil units 182-190. This part 196 in coil unit 191 serves a similar function to the above mentioned part 195 in coil unit 191.

The third coil structure is represented by parts 197 shown radially outside parts 196, and the fourth coil structure is represented by parts 198 shown radially outside parts 197. The numbers of turns for the third and fourth coil structures in each of the coil units 182-190 is selected to provide the appropriate required number of turns per unit length along the bar. Further parts 197 and 198 in the double length coil unit 191 are connected in series with and wound with opposite hand to the corresponding parts in coil units 182-190. These parts 197 and 198 in the coil unit 191 serve similar functions to parts 195 and 196 in coil unit 191.

The table below indicates the number of turns in each of the coil units for the coil structures in order to provide quadrupole, hexapole, octopole and decapole distributions of magnetic field as described.

| Coil Structure | Field | Coil Unit Reference | | | | | | | | | |
|---|---|---|---|---|---|---|---|---|---|---|---|
| | | 182 | 183 | 184 | 185 | 186 | 187 | 188 | 189 | 190 | 191 |
| 1st | Quadrupole | 20 | 20 | 20 | 20 | 20 | 20 | 20 | 20 | 20 | −60 |
| 2nd | Hexapole | 1 | 4 | 6 | 8 | 11 | 13 | 15 | 18 | 20 | −30 |
| 3rd | Octopole | — | 1 | 2 | 3 | 6 | 8 | 12 | 15 | 20 | −20 |
| 4th | Decapole | — | — | 1 | 1 | 3 | 5 | 9 | 14 | 20 | −20 |

The maximum number of turns for a particular coil structure in a single one of the coil units 182-190 in the table above is 20, though of course more or less turns may be provided so long as the ratios over the different coil units are maintained in order to provide the desired field intensity distribution. Also, the number of coil units provided to form the coil structures may be different from the nine in this example, provided again that the ratios of turns in the different coil units are set to provide the desired field intensity distributions. The numbers of turns for the coil unit 191 are given in the table as negative values to indicate that they are wound with opposite hand, as described above.

Importantly, the coil unit parts 195 which together form the first coil structure, are themselves connected one after the other in series as a continuous winding extending between the mid-point 181 of the bar 161 and the end 180 of the bar. Similarly, the parts of the coil units forming each of the second, third and fourth coil structures are also connected together in series as a continuous winding. The continuous winding illustrated in FIG. 13 of the first coil structure is itself connected in series with the corresponding continuous winding to the right of the mid-point 181 over the rest of the bar 161, so that the first coil structure over the full length of the bar 161 is connected to a respective power supply unit by a single pair of power leads (not shown in FIG. 13). On the other hand, the continuous winding of the second coil structure illustrated in FIG. 13, formed by the parts 196 of the coil units 182-191 is not connected directly in series with the corresponding coil unit parts 196 to the right of the mid-point 181 along the bar 161. The continuous windings on each side of the mid-point 181 are separately connected via power leads to respective power supplies as explained previously. Similarly, the continuous windings of the third and fourth coil structures in FIG. 13 on opposite sides of the mid-point 181 are independently connected via respective power leads to respective power supplies.

Throughout the description of the embodiments and examples so far, it has been made clear that the coil structures on the opposed ferromagnetic bars of the beam modifying structure, are energized oppositely on the two bars, so as to generate opposed magnetic poles between the two bars, forming a magnetic field extending in the y direction across the elongate space between the two bars. This magnetic field, in the y direction, is effective to deflect beam ions selectively in the x-direction, in the plane of the ribbon beam.

Figure 14A:
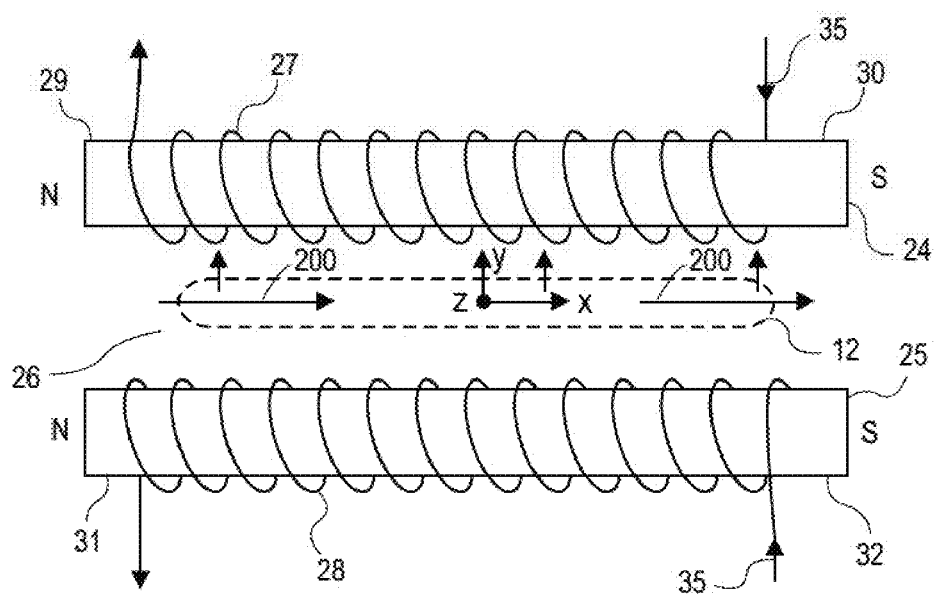
FIG. 14A in combination with FIGS. 14B and 14C provide a schematic illustration of an example of the invention producing x-direction magnetic fields for y-deflection of ions of the ribbon beam.

It will be understood by the skilled person that, if the current in a coil structure on one of the bars is reversed, then similar magnetic poles may be formed at juxtaposed ends, for example, of the two ferromagnetic bars. FIG. 14A is a schematic illustration of the first coil distribution as shown in FIG. 2A. The only difference is that the direction of current in the first coil structure 27 on the upper bar 24 is reversed compared to FIG. 2A. As a result, both of the two bars 24 and 25 develop North poles at juxtaposed ends 29 and 31 and South poles at juxtaposed ends 30 and 32, so that there is a uniform magnetic field component extending in the x-direction in the elongate space 26, as illustrated by arrows 200. Such a uniform field extending in the x-direction, an x-field, is effective to deflect the ions of beam 12 between the bars 24 and 25 in the y direction (for a beam direction directly out of the paper in FIG. 14A). Because the x-field is uniform with x, the ribbon beam is evenly deflected across its width in the y direction.

Figure 14B:
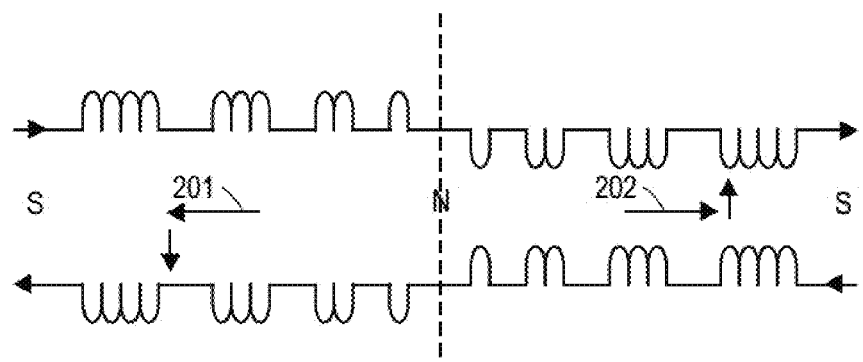

FIG. 14B illustrates second coil structures corresponding to the arrangement of FIG. 2B. However, in FIG. 14B, the current direction in the second coil structure in the lower bar 25 is reversed. As a result, x-direction magnetic field components are produced along the elongate space 26 between the bars, in the direction of arrows 201 and 202 outwards from an effective North pole at the mid-points of the bars 24 and 25, to South poles at both pairs of juxtaposed ends of the bars.

Figure 14C:
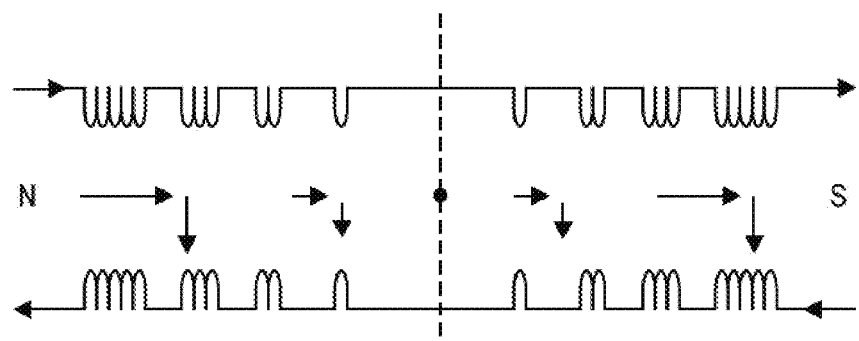

FIG. 14C illustrates third coil structures of the same form as those shown in FIG. 2C described above, except that the current direction in the third coil structure on the lower bar 25 is reversed. This arrangement again produces x-direction magnetic field in the elongate space between the bars, extending with varying intensity between a North pole at the left hand bar ends to a South pole at the right hand bar ends.

Figure 15:
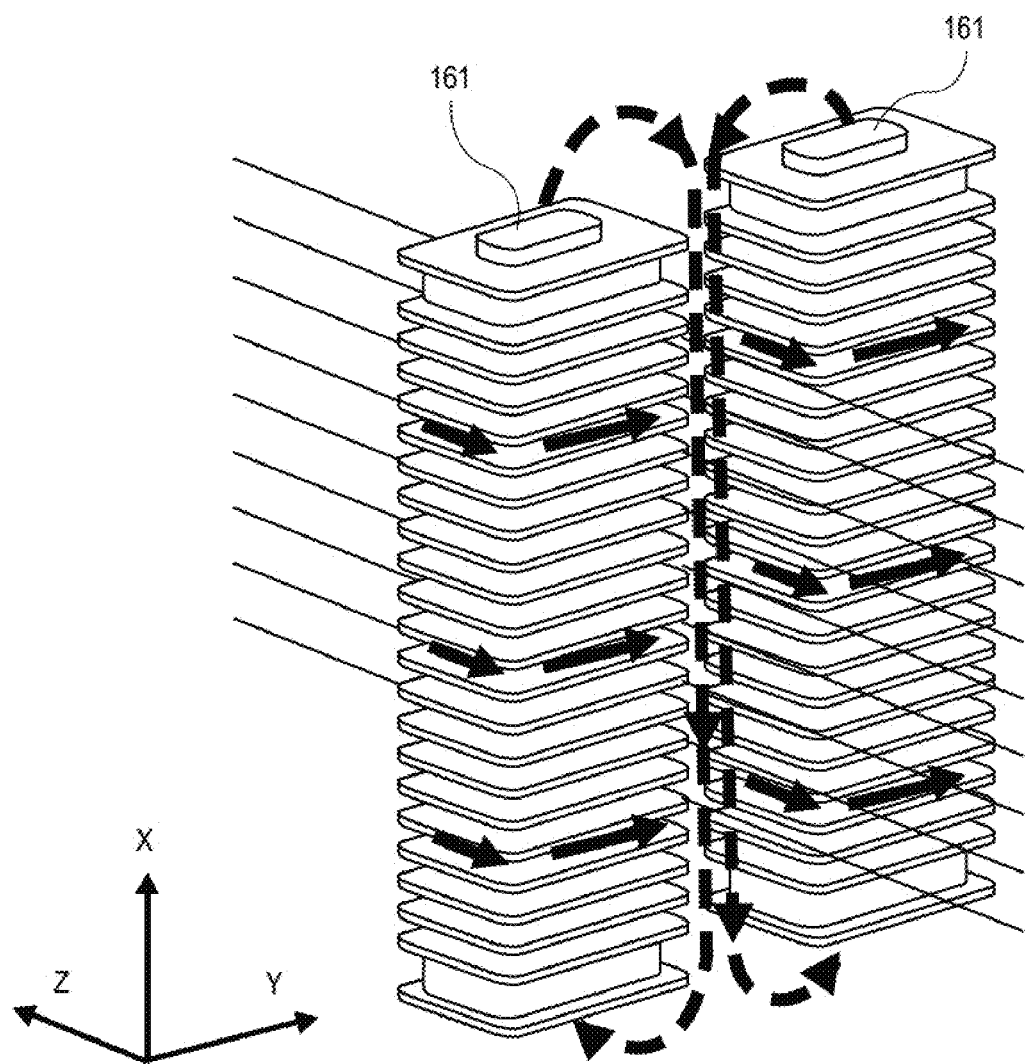
FIG. 15 is a perspective view of bars of the ribbon beam modifying structure of FIG. 11, showing the x-direction magnetic field component produced according to an example of the invention.
Figure 16:
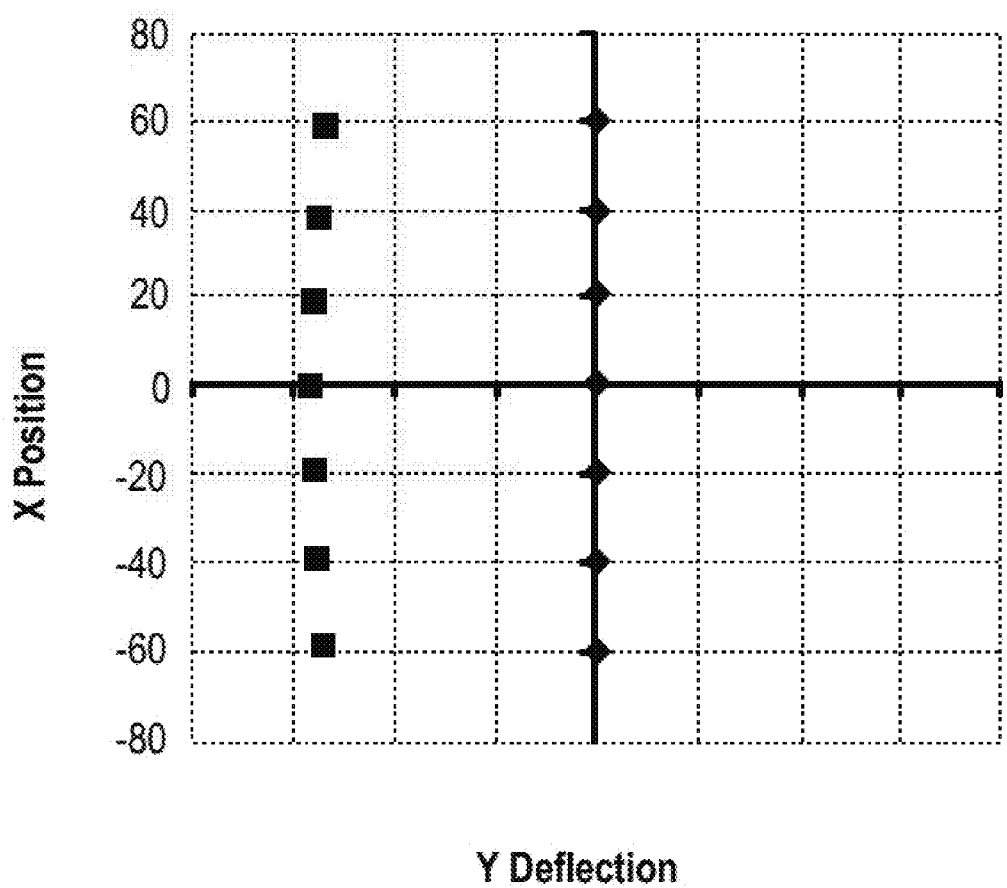
FIG. 16 is a graphical representation of the y-deflection that can be applied to a ribbon-shaped beam with the arrangement of FIG. 15.

FIG. 15 is a schematic illustration of the coil structures on ferromagnetic bars 161 illustrating the arrangement of FIG. 14A. The dashed lines in FIG. 15 represent the magnetic field extending between the bars in the x-direction. The effect of such a uniform x-field as illustrated in FIG. 15 is to provide a uniform deflection of the ribbon beam in the y direction, as illustrated graphically in FIG. 16. As shown in FIG. 16, points on the ribbon beam at different x locations, are deflected by the uniform x-field substantially similar amounts in y.

Figure 17:
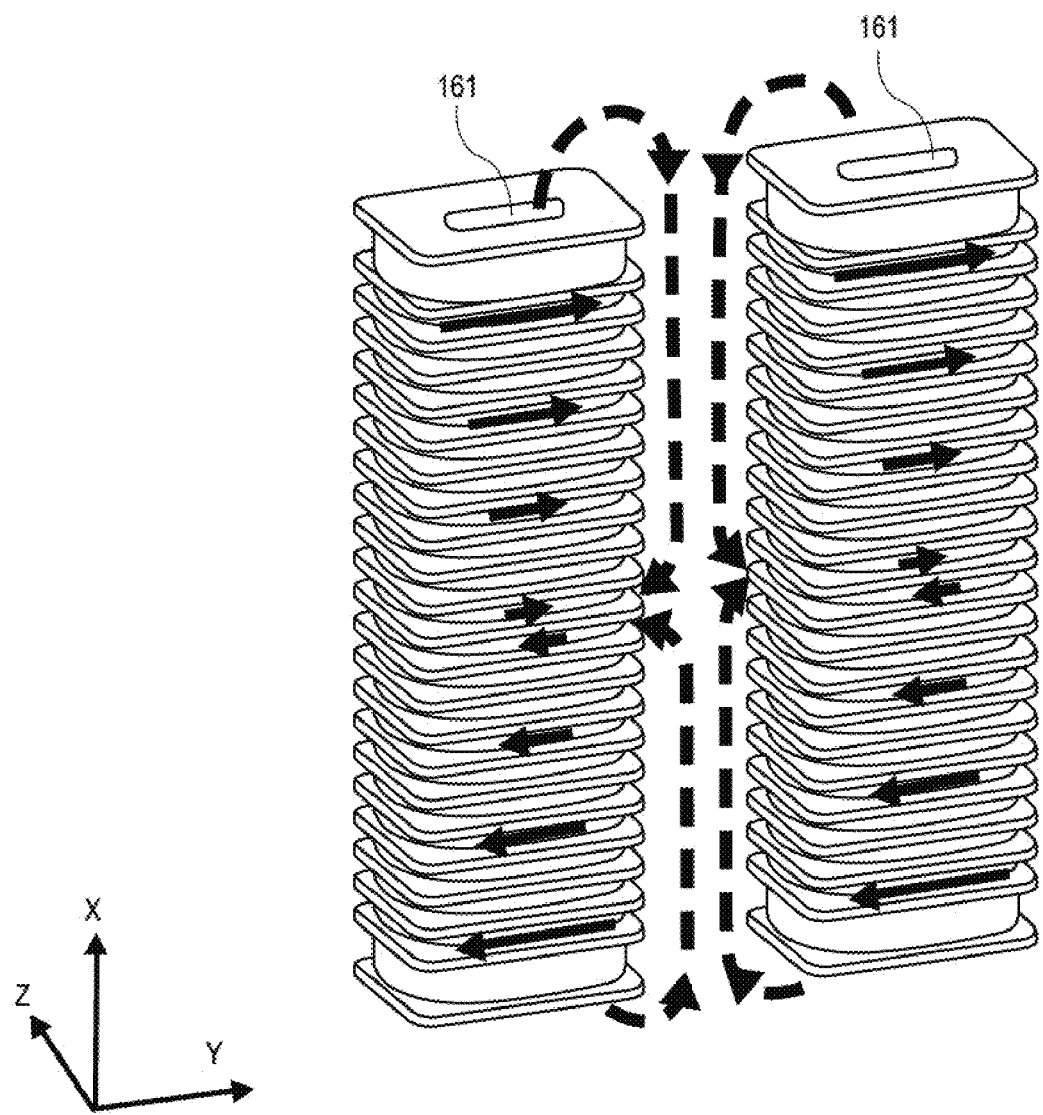
FIG. 17 is a perspective view of the beam modifying structure of FIG. 11 illustrating a non-uniform distribution of x-direction magnetic field.
Figure 18:
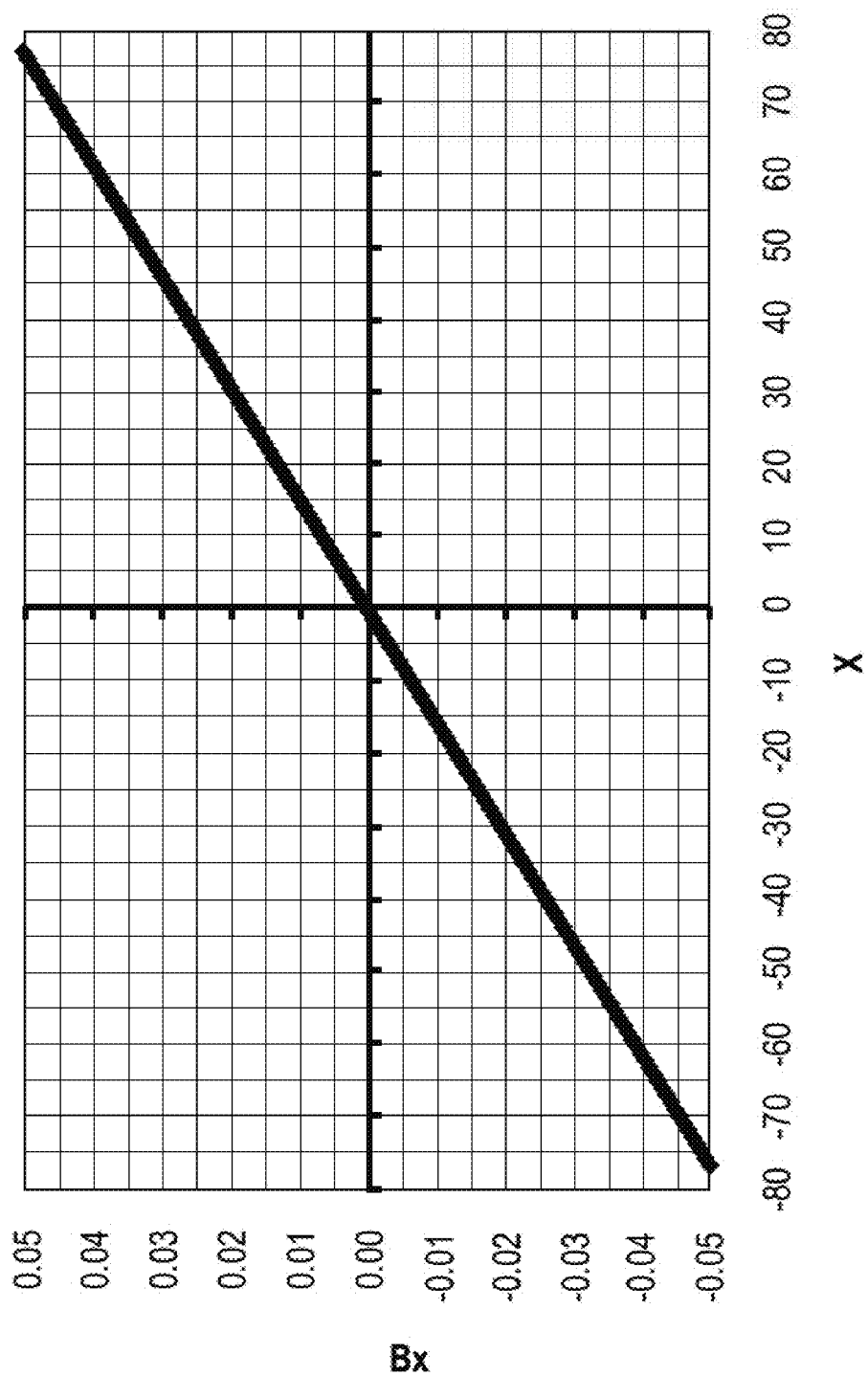
FIG. 18 is a graphical representation of such a non-uniform distribution of x-direction magnetic field which varies linearly with x.
Figure 19:
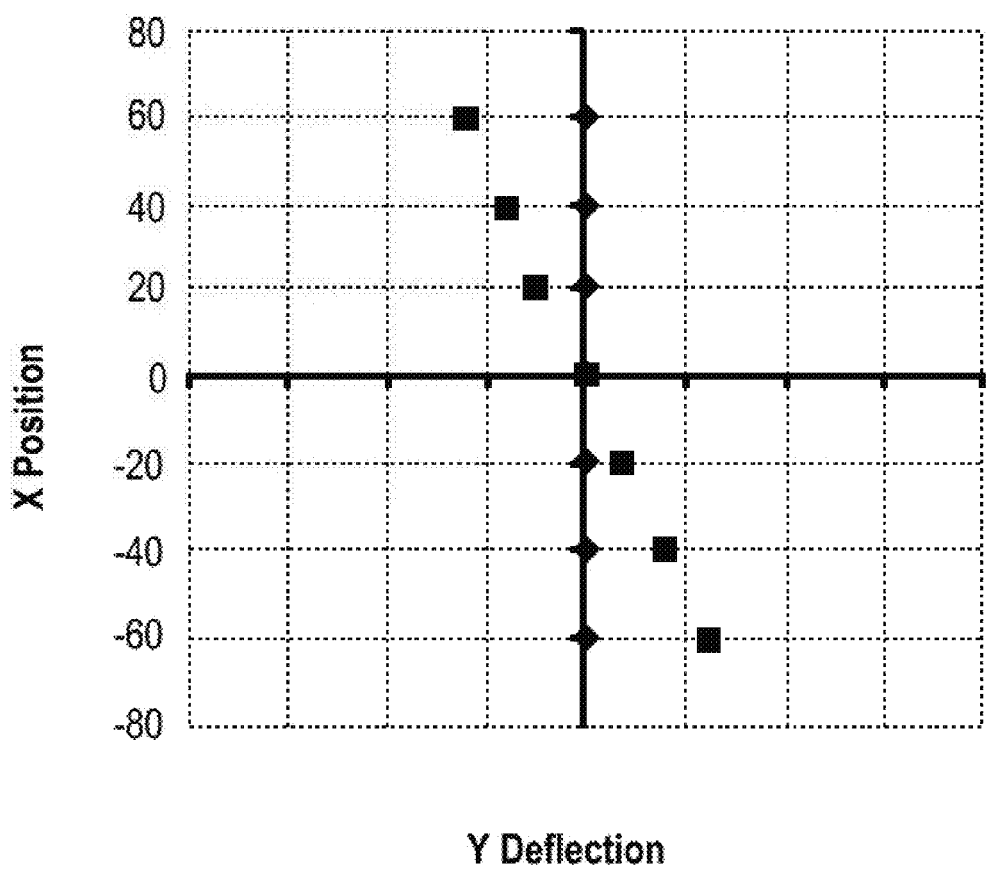
FIG. 19 is a graphical representation of the y-deflection on a ribbon beam caused by the linearly varying x-direction magnetic field of FIG. 18.

FIG. 17 again illustrates the coil structures on ferromagnetic bars 161, this time illustrating the effect of energizing the second coil structures as shown in FIG. 14B. In FIG. 17, the solid arrows indicate the effective ampere turns at different locations along the bars, and the dashed lines illustrate the x-direction magnetic field produced. FIG. 18 is a graphical representation of the intensity of the x-direction field produced by the second coil distribution of FIG. 14B, energized as described. The x-direction field varies linearly with x from a maximum of one polarity at one end of the elongate space between the bars, through zero at a mid-point between the bars, to a maximum of opposite polarity at the other end of the bars. Such a linearly varying x-direction magnetic field between the bars, applies a y deflection to ions of the ribbon beam, which varies linearly with x, as illustrated in FIG. 19.

Figure 20:
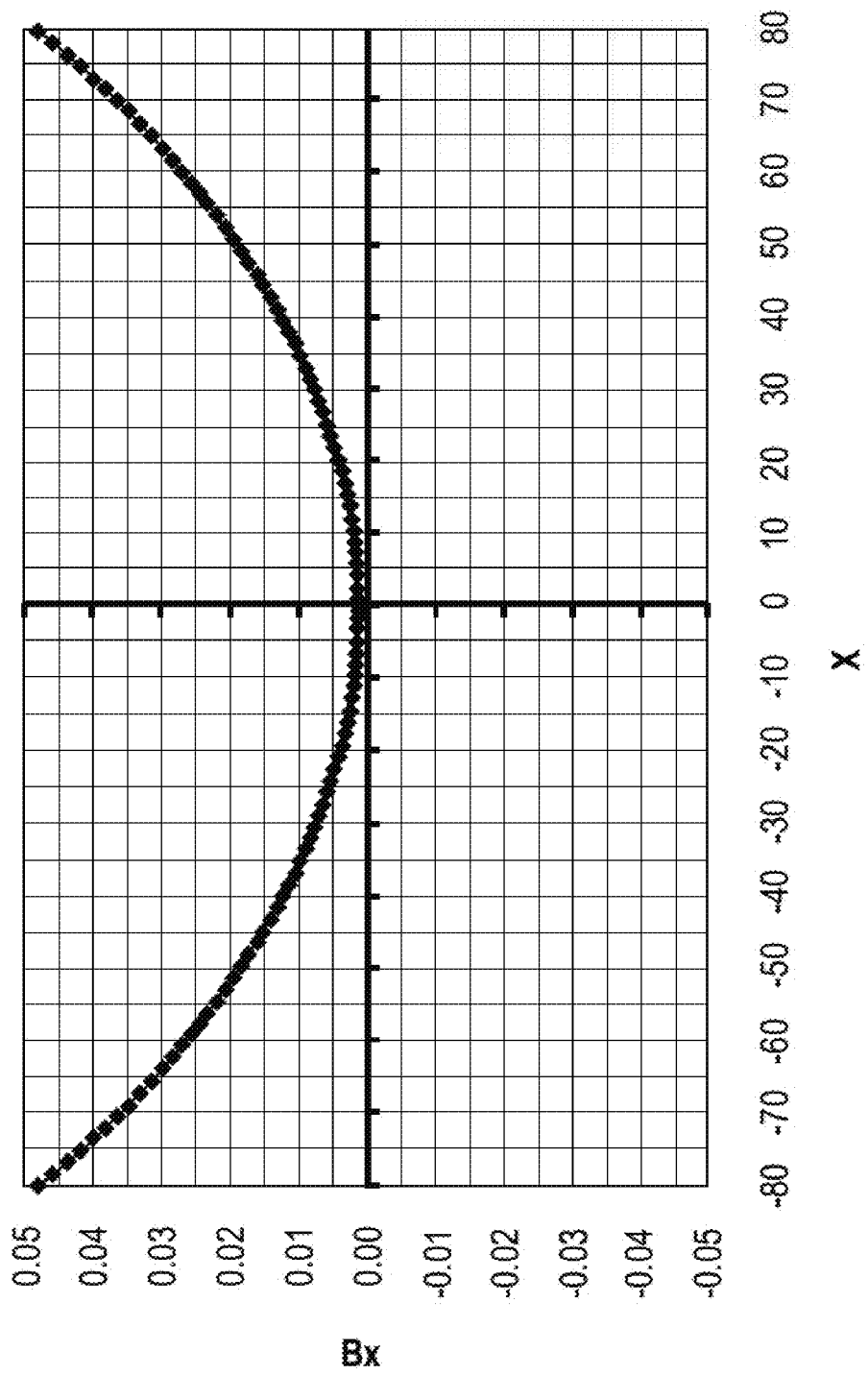
FIG. 20 is a graphical representation of another non-uniform distribution of x-direction magnetic field that may be produced by the ribbon beam modifying structure of FIG. 11.
Figure 21:
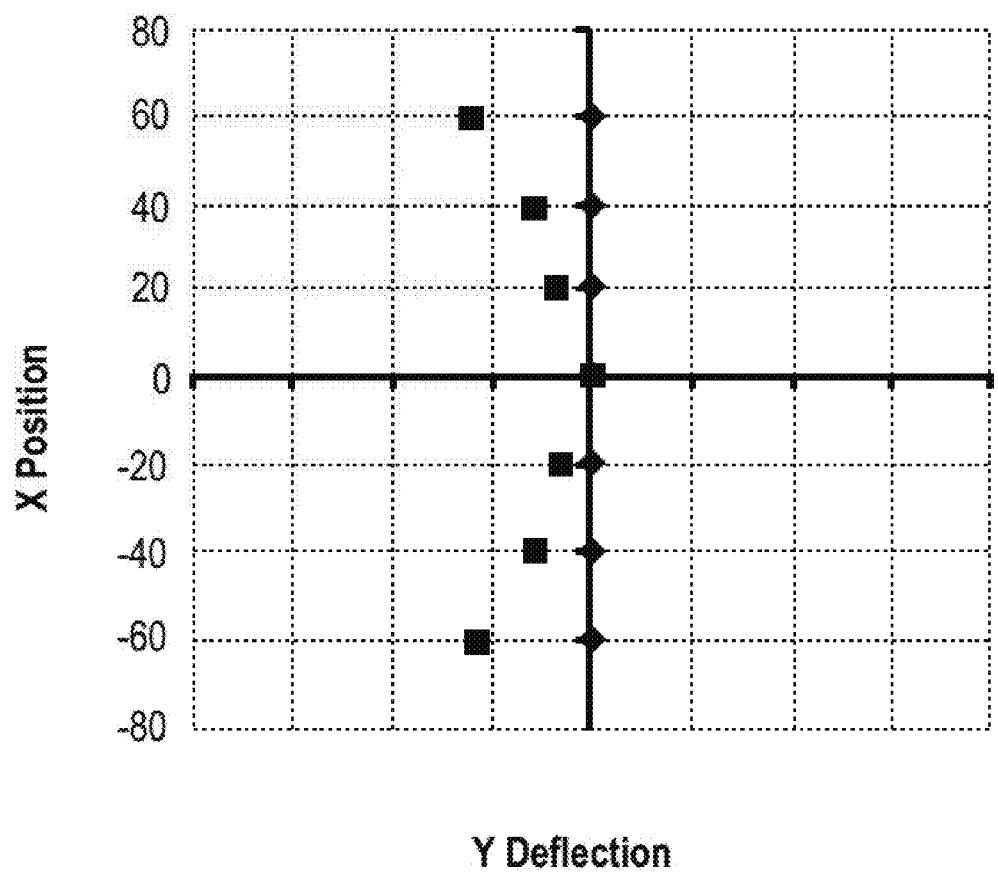
FIG. 21 is a graphical representation of the y-deflection of a ribbon beam that can be produced by the non-uniform x-direction field of FIG. 20.

The x-direction magnetic field formed by the third coil structures energized as illustrated in FIG. 14C varies with x over the length of elongate space 26 between the bars, as illustrated in FIG. 20. Accordingly, the x-direction magnetic field varies from a maximum at one end of the elongate space between the bars, through zero at a mid-point between the bars, back to the same maximum intensity at the other end of the bars. The resulting y deflection of beam ions varies with x-position in the ribbon beam as illustrated in FIG. 21.

It should be understood that the x-direction magnetic field components produced by the arrangements illustrated in FIGS. 14A, 14B and 14C may be provided additionally and at the same time as y component field distributions as discussed with reference to FIGS. 2A, 2B and 2C. Programmable power supplies connected to drive currents through the coil structures illustrated in these Figures can be programmed to provide currents through the continuous windings of the coil structures which comprise components designed to energize the coil structures to produce y direction magnetic field components, as discussed above with reference to FIGS. 2A, 2B and 2C, and further current components intended to produce x magnetic field components as discussed with reference to FIGS. 14A, 14B and 14C.

More generally, in accordance with examples and embodiments of the invention, the second and third coil structures described may be used with currents as illustrated in FIGS. 14B and 14C, to generate x-direction fields between the bars 24 and 25 which are non-uniform and vary with a desired function of x. In the two examples given in FIGS. 14B and 14C, a non-uniform x-field which varies linearly with x is disclosed, using the second coil structures as described, and a non-linear x-field component which varies with x in accordance with the function illustrated in FIG. 20 is disclosed, using the third coil structures.

Furthermore, x-direction magnetic field components can be produced using the first, second, third and fourth coil structures as illustrated in FIGS. 3A, 3B, 3C and 3D, by selecting appropriate current directions through the continuous winding parts of the various coil structures. Similar considerations apply as discussed above with respect of FIGS. 14A, 14B and 14C. The use of the divided coil structures having separate continuous winding parts on opposite sides of the mid-point of the ferromagnetic bars 24 and 25, as shown in FIGS. 3B, 3C and 3D, provides additional flexibility, allowing the x-direction magnetic fields produced between the bars to be asymmetrical about the mid-point of the bars.

Importantly, x-direction fields can also be produced using the fourth coil structures illustrated in FIG. 3D by selecting appropriate current directions through the continuous winding parts of the coil structure.

It is also possible to provide additional coil structures on the ferromagnetic bars 24 and 25, for the purpose of providing additional distributions of magnetic x-field component as required. Although in the above described examples, the first, second, third and optionally fourth coil structures may be used simultaneously or separately to produce both x-field components and y-field components, instead y component fields may be produced using only separate coil structures additionally applied to the ferromagnetic bars. It should also be understood that other beam modifying structures may be used to generate magnetic field components extending in the x-direction of a ribbon beam and having a non-uniform intensity which varies as a function of x.

Figure 22:
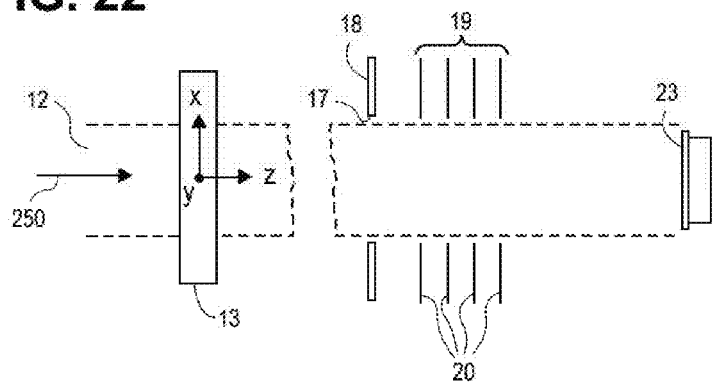
FIG. 22 is a schematic detailed representation of part of the ion implanter apparatus of FIG. 1.

More particularly, arrangements using magnetic field components extending in the x-direction of a ribbon-shaped beam, in order to apply desired y deflection of the beam, have special application in the field of ion implantation using high current, high energy ribbon-shaped beams. FIG. 22 provides a schematic detailed illustration of elements of the ion implanter structure first described with reference to FIG. 1. In FIG. 22, the ribbon-shaped beam 12 from ion source 10 is shown with a beam direction indicated by arrow 250.

As explained with respect to FIG. 1, the beam 12 is accelerated to a first energy by the extraction electrodes 11 at the ion source. After passing through the beam modifying structure 13, the beam passes through the beam defining aperture 17 of entrance plate 18, at an object plane in front of the biased apertured electrodes 20 of the acceleration assembly 19. Although the beam 12 is shown extending in a straight line from left to right in FIG. 22 from the beam modifying structure 13 to the acceleration assembly 19, the beam may pass through the bending dipole magnet structure 14 as illustrated in FIG. 1, and other beam elements.

As explained, the acceleration assembly 19 applies substantial further energy to the ribbon beam before the ribbon beam impinges upon the substrate 23 to be implanted, located in the process chamber. The described structure is especially useful for producing a ribbon beam at the substrate 23 to be implanted, which not only has a high energy, typically above 400 keV, but also a relatively high current, typically several 10 s of milliamps. The entrance plate 18, with its beam defining aperture 17, is important in ensuring that the ribbon beam entering the acceleration assembly 19 has a limited lateral extent, both in the y and x-directions of the ribbon beam, which will pass through the apertured electrodes of the acceleration assembly with minimal grazing of the edges of the apertures of the acceleration electrodes 20. Even small amounts of interception of the ribbon beam by the edges of the acceleration electrode apertures can upset the uniformity of the grading of bias voltages along the acceleration stack, and lead to arcing within the acceleration assembly. Achieving good alignment of the ribbon beam 12 with the beam defining aperture 17 of the entrance plate 18 can be achieved in the x-direction of the beam, by adjusting the dipole field applied by the primary dipole magnet structure 14 used for filtering out unwanted ion species from the beam as has been mentioned above. It is also straightforward to apply a small x-direction deflection to the beam using the beam modifying structure, by controlling the net dipole field applied by the structure, e.g. by controlling the dipole field between the ferromagnetic bars of the examples described above using the winding 168 on the yoke 166 (see FIG. 11).

Figure 23:
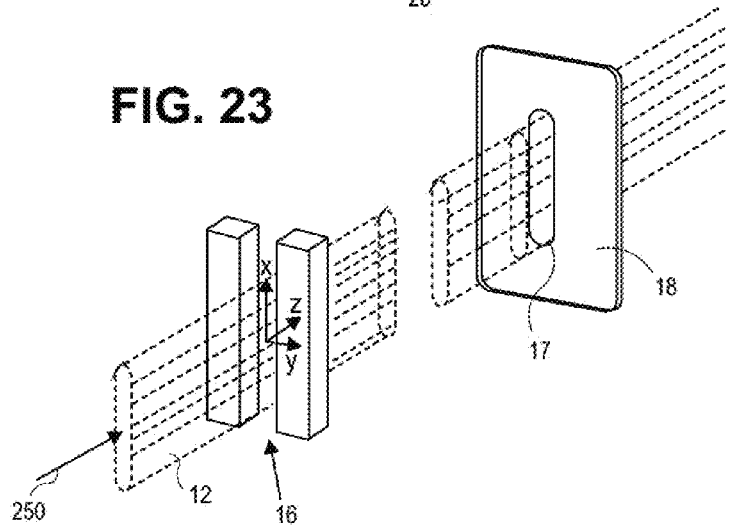
FIG. 23 is a schematic, perspective view of the apparatus of FIG. 22.
Figure 23:
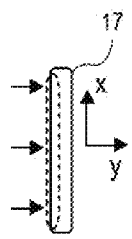
Figure 23:
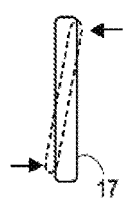
Figure 23:
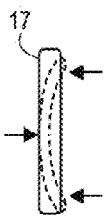
Figure 23:

FIG. 23 illustrates the beam 12 passing through the beam modifying structure 13, and proceeding, with good alignment through the beam defining aperture 17 of the entrance plate 18. In order to achieve good alignment in the y direction of the beam, the beam modifying structure can apply a field extending in the x-direction along the x-axis of the ribbon-shaped beam designed to apply selected y deflections about said axis to ions of the ribbon beam.

FIGS. 24A, 24B, 24C and 24D illustrate various corrections in the y direction of the beam that may be necessary for the beam to pass accurately through the slot of the beam defining aperture 17. In FIG. 24A, the ribbon-shaped beam is shown at the location of the entrance plate 18 slightly misaligned in the y direction. The slot of the beam defining aperture 17 has a long dimension which is linear. In FIG. 24A, the ion beam, which is shown dotted, has good linear shape in the elongate direction of the cross-section of the ion beam, but is slightly to the left of the beam defining aperture.

By using the beam modifying structure 13 to generate an x-direction magnetic field component which has uniform intensity over x, all parts of the ribbon beam can be deflected at the beam modifying structure slightly in the y direction about the x-axis, so that the deflected ribbon beam is now perfectly aligned with the beam defining aperture 17 when it reaches the entrance plate 18, as shown in FIG. 24D.

Referring to FIG. 24B this illustrates an ion beam which is well centered on the beam defining aperture 17 of the entrance plate 18, but the plane of the ribbon-shaped beam is slightly twisted relative to the alignment of the aperture 17. To correct for this, the beam modifying structure 13 applies an x-direction magnetic field component which is non-uniform with x, varying between a maximum intensity of one polarity at one end of the ribbon beam cross-section and a maximum intensity of the opposite polarity at the other end of the beam cross-section. As explained previously with respect to FIGS. 14B, 17, 18 and 19, such a non-uniform x directed magnetic field component can have the effect of deflecting ions of the ribbon beam so as to apply a twist to the ribbon beam, so that the beam is brought into perfect alignment at the entrance plate, again as illustrated in FIG. 24D.

Referring now to FIG. 24C, this shows a beam which has a cross-sectional shape which is curved, so that it will not fit over the full width of the ribbon correctly through the linear slot of the beam defining aperture 17. The beam modifying structure 13 is then arranged to apply x directed magnetic field components which vary over x so as to apply suitable correcting y deflections to the different parts of the ion beam so as to flatten the cross-sectional shape of the ion beam when the beam reaches the entrance plate 18, in order to pass correctly through the beam defining aperture 17.

The required distributions of intensity of x directed magnetic field can be provided with the arrangements discussed above in relation to FIGS. 14A to 14C, 20 and 21.

As described above with respect to FIGS. 22, 23 and 24A-24D, x-direction magnetic fields provided at the beam modifying structure 13 apply small angular deflections in the y-direction to ions of the beam, in order to establish the appropriate spatial correction of the beam cross-section, when the beam arrives at the entrance plate 18. The entrance plate 18 is located at an object focal point of the accelerator assembly 19. The skilled person will understand that the electrostatic accelerating fields produced by the acceleration assembly 19 have an ion optical effect on the ions of the beam passing through the slot of the aperture 17 in the entrance plate 18, such that ions with vectors at an angle to the general beam direction, are focused, at the entrance of the accelerator assembly, so as effectively to become collimated parallel to the axis of the assembly. Accordingly, so long as the ions of the ribbon-shaped beam are correctly aligned to pass through the aperture 17 of the entrance plate 18, they can then reliably pass through the individual apertures of the biased electrodes 20. This is important to minimize impacts of high energy ions with the electrodes of the accelerator assembly, for the reasons mentioned previously.

A variety of embodiments have been provided for clarity and completeness. Other embodiments of the invention will be apparent to one of ordinary skill in the art when informed by the present specification. Detailed methods of and systems for implantation have been described herein, but any other methods and systems can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method of modifying a ribbon-shaped ion beam having an elongate cross-section normal to a beam direction, wherein at any position along said ribbon-shaped beam an orthogonal (x, y, z) Cartesian co-ordinate system is defined in which a z-axis of the co-ordinate system extends in the beam direction at a center line of said ribbon-shaped beam, an x-axis extends in a long direction of said elongate cross-section of said ribbon-shaped beam, and a y-axis extends in a short direction of said elongate cross-section, the method comprising the steps of:

providing opposed ferromagnetic bars each having a length and defining between them an elongate open space to accommodate said ribbon-shaped beam passing between the bars with the x-axis of the beam extending along a length of said elongate space;

providing, on each of said opposed ferromagnetic bars, a respective first coil structure comprising a continuous winding which has a first predetermined distribution along said length of the bar of turns per unit of length, said first predetermined distribution being selected to provide, when said first coil structures are selectively energized, a first component magnetic field in a y-direction in said elongate open space between said opposed ferromagnetic bars, said first component magnetic field having a corresponding first distribution of magnetic field intensity over said length of said open space in an x-direction;

providing, on each of said opposed ferromagnetic bars, at least a respective second coil structure comprising at least one continuous winding which has a second predetermined distribution along said length of the bar of turns per unit length, said second predetermined distribution being selected to provide, when said second coil structures are selectively energized, a second component magnetic field in said y-direction in said elongate open space between said opposed ferromagnetic bars, said second component magnetic field having a corresponding second distribution of magnetic field intensity over at least a part of said length of said open space in said x-direction; and passing said ribbon-shaped beam through said elongate open space between said opposed ferromagnetic bars; and selectively energizing said respective first and second coil structures with electric currents to apply a desired modification to said ribbon-shaped ion beam.

2. A method as claimed in claim 1, further comprising the steps of providing, on each of said opposed ferromagnetic bars as said respective second coil structure, a further continuous winding in addition to said one continuous winding, said one and said further continuous windings being located on opposite sides of a mid-point of the length of said ferromagnetic bar and together providing said second predetermined distribution of turns per unit length, whereby said second component magnetic field provided when both said one and said further continuous windings are selectively energized has said corresponding second distribution of magnetic field intensity over the length of said elongate open space; and selectively and independently energizing said one and said further continuous windings of said second coil structures.

3. A method as claimed in claim 1, wherein said first distribution of magnetic field intensity is a quadrupole distribution.

4. A method as claimed in claim 3, wherein said second distribution of magnetic field intensity is a hexapole distribution.

5. A method as claimed in claim 1, comprising the further step of providing on each of said opposed ferromagnetic bars, a respective third coil structure comprising at least one continuous winding which has a third predetermined distribution along said length of the bar of turns per unit length, said third predetermined distribution being selected to provide, when said third coil structures are selectively energized, a third component magnetic field in said y-direction in said elongate open space between said opposed ferromagnetic, said third component magnetic field having a corresponding third distribution of magnetic field intensity over at least a part of said length of said open space in said x-direction; and further selectively energizing said respective third coil structures.

6. A method as claimed in claim 5, further comprising the steps of providing, on each of said opposed ferromagnetic bars as said respective third coil structure, a further continuous winding in addition to said one continuous winding, said one and said further continuous windings being located on opposite sides of a mid-point of the length of said ferromagnetic bar and together providing said third predetermined distribution of turns per unit length, whereby said third component magnetic field provided when both said one and said further continuous windings are selectively energized has said corresponding third distribution of magnetic field intensity over the length of said elongate open space; and selectively and independently energizing said one and said further continuous windings of said third coil structures.

7. A method as claimed in claim 5, wherein said first, second and third distributions of magnetic field intensity are respectively quadrupole, hexapole and octopole distributions.

8. A method as claimed in claim 5, comprising the further step of providing on each of said opposed ferromagnetic bars, a respective fourth coil structure comprising at least one continuous winding which has a fourth predetermined distribution along said length of the bar of turns per unit length, said fourth predetermined distribution being selected to provide, when said fourth coil structures are selectively energized, a fourth component magnetic field in said y-direction in said elongate open space between said opposed ferromagnetic bars, said fourth component magnetic field having a corresponding fourth distribution of magnetic field intensity over at least a part of said length of said open space in said x-direction; and further selectively energizing said respective fourth coil structures.

9. A method as claimed in claim 8, further comprising the steps of providing, on each of said opposed ferromagnetic bars as said respective fourth coil structure, a further continuous winding in addition to said one continuous winding, said one and said further continuous windings being located on opposite sides of a mid-point of the length of said ferromagnetic bar and together providing said fourth predetermined distribution of turns per unit length, whereby said fourth component magnetic field provided when both said one and said further continuous windings are selectively energized has said corresponding fourth distribution of magnetic field intensity over the length of said elongate open space; and selectively and independently energizing said one and said further continuous windings of said fourth coil structures.

10. A method as claimed in claim 8, wherein said first, second, third and fourth distributions of magnetic field intensity are respectively quadrupole, hexapole, octopole and decapole distributions.

11. A method as claimed in claim 1, comprising the further step of controlling a dipole component of magnetic field intensity across said elongate open space between said opposed ferromagnetic bars.

12. A method as claimed in claim 11, wherein said dipole field intensity is controlled by connecting a ferromagnetic yoke between mid-points of said opposed ferromagnetic bars.

13. A method as claimed in claim 1, wherein at least one of said first coil structures and said second coil structures are energized to provide an additional component magnetic field which is directed in the x-direction along said length of said elongate space to apply y-deflections about said x-axis to ions of the ribbon-shaped beam.

14. A method as claimed in claim 3, wherein at least said first coil structures are energized to provide a first additional component magnetic field which is directed in the x-direction along said length of said elongate space to apply y-deflections about said x-axis to ions of the ribbon-shaped beam, said first additional component magnetic field having a uniform intensity along said x-axis.

15. A method as claimed in claim 4, wherein at least said second coil structures are energized to provide a second additional component magnetic field which is directed in the x-direction along said length of said elongate space to apply y-deflections about said x-axis to ions of the ribbon-shaped beam, said second additional component magnetic field having a non-uniform intensity which varies linearly with x.

16. A method as claimed in claim 10, wherein at least one of said third coil structures and said fourth coil structures are energized to provide at least a respective one of corresponding third and fourth additional component magnetic fields each of which is directed in the x-direction along said length of said elongate space to apply y-deflections about said x-axis to ions of the ribbon-shaped beam, each of said third and fourth additional component magnetic fields having a respective non-uniform intensity which varies with a respective predetermined function of x.

17. Apparatus for modifying a ribbon-shaped ion beam having an elongate cross-section normal to a beam direction, wherein at any position along said ribbon-shaped beam an orthogonal (x, y, z) Cartesian co-ordinate system is defined in which a z-axis of the co-ordinate system extends in the beam direction at a center line of said ribbon-shaped beam, an x-axis extends in a long direction of said elongate cross-section of said ribbon-shaped beam, and a y-axis extends in a short direction of said elongate cross-section, said apparatus comprising:

a pair of opposed ferromagnetic bars each having a length and defining between them an elongate open space to accommodate said ribbon-shaped beam passing between the bars with the x-axis of the beam extending along a length of said elongate space;

a respective first coil structure, on each of said opposed ferromagnetic bars, wherein said respective first coil structures each comprise a continuous winding and have a first predetermined distribution, along said length of the bar, of turns per unit length, said first predetermined distribution being selected to provide, when said first coil structures are selectively energized, a first component magnetic field transversely across said elongate open space between said opposed bars, said first component magnetic field having a corresponding first distribution of magnetic field intensity over said length of said elongate open space;

a respective second coil structure, on each of said opposed ferromagnetic bars, wherein said respective second coil structures each comprise a pair of continuous windings a respective one of said pair being on each of opposite sides of a mid-point of the length of the respective said ferromagnetic bar, said pair of continuous windings having a second predetermined distribution of turns per unit length, along the length of the bar, wherein said second predetermined distribution is selected to provide, when said second coil structures are selectively energized, a second component magnetic field transversely across said elongate open space between said opposed ferromagnetic bars, said second component magnetic field having a corresponding second distribution of magnetic field intensity over said length of said elongate open space; and respective power supply leads to said continuous winding of each said first coil structure and to each of said pair of continuous windings of each said second coil structure.

18. Apparatus as claimed in claim 17, wherein said first predetermined distribution of turns per unit length of said continuous windings of said first coil structures is selected so that said corresponding first distribution of magnetic field intensity is a first multipole distribution, and said second predetermined distribution of turns per unit length of said pairs of continuous windings of said second coil structures is selected so that said corresponding second distribution of magnetic field intensity is a second multipole distribution of a different order to said first multipole distribution.

19. Apparatus as claimed in claim 18, wherein said first multipole distribution is a quadrupole distribution and said second multipole distribution is a hexapole distribution.

20. Apparatus as claimed in claim 17, further comprising:

a respective third coil structure, on each of said opposed ferromagnetic bars, wherein said respective third coil structures each comprise a pair of continuous windings on opposite sides of the mid-point of the length of the respective said ferromagnetic bar, said pair of continuous windings having a third predetermined distribution of turns per unit length, along the length of the bar, wherein said third predetermined distribution is selected to provide, when said third coil structures are selectively energized, a third component magnetic field transversely across said elongate open space between said opposed ferromagnetic bars, said third component magnetic field having a corresponding third distribution of magnetic field intensity over said length of said elongate open space; and further respective power leads to each of said pair of continuous windings of each said third coil structures.

21. Apparatus as claimed in claim 20, wherein said first, second and third distributions of turns per unit length of said continuous windings of said first, second and third coil structures are respectively selected so that said corresponding first, second and third distributions of magnetic field intensity are respectively quadrupole, hexapole and octopole distributions.

22. Apparatus as claimed in claim 20, further comprising:

a respective fourth coil structure, on each of said opposed ferromagnetic bars, wherein said respective fourth coil structures each comprise a pair of continuous windings on opposite sides of the mid-point of the length of the respective said ferromagnetic bar, said pair of continuous windings having a fourth predetermined distribution of turns per unit length, along the length of the bar, wherein said fourth predetermined distribution is selected to provide, when said fourth coil structures are selectively energized, a fourth component magnetic field transversely across said elongate open space between said opposed ferromagnetic bars, said fourth component magnetic field having a corresponding fourth distribution of magnetic field intensity over said length of said elongate open space; and further respective power leads to each of said pair of continuous windings of each said fourth coil structures.

23. Apparatus as claimed in claim 22, wherein said first, second, third and fourth distributions of turns per unit length of said continuous windings of said first, second, third and fourth coil structures are respectively selected so that said corresponding first, second, third and fourth distributions of magnetic field intensity are respectively quadrupole, hexapole, octopole and decapole distributions.

24. Apparatus as claimed in claim 17, comprising a ferromagnetic yoke interconnecting said mid-points of said opposed ferromagnetic bars.

25. Apparatus as claimed in claim 17, comprising a pair of ferromagnetic core pieces, each of the pair interconnecting a respective pair of adjacent ends of said opposed ferromagnetic bars, and a respective bucking coil wound on each said ferromagnetic core piece.

26. Apparatus as claimed in claim 17, wherein each of said opposed ferromagnetic bars carries a corresponding even number of coil units distributed evenly along the respective said bar symmetrically on either side of said mid-point of said bar, and each of said coil units carries coil turns of said windings of a plurality of said coil structures, wherein the number of said coil turns in respective said coil units for each of said coil structures is determined in accordance with the respective said predetermined distribution of turns per unit length of the respective said coil structure.

27. Apparatus as claimed in claim 26, further comprising ferromagnetic tabs located between each adjacent pair of said coil units on each said ferromagnetic bar, said tabs extending towards said elongate open space.

28. Apparatus as claimed in claim 17 including programmable power supplies connected to said power supply leads for delivering predetermined currents to said continuous windings, wherein said programmable power supplies are arranged to deliver said predetermined currents having first current components which energize said continuous windings to provide opposed magnetic poles on said pair of opposed ferromagnetic bars to provide said first and second component magnetic fields.

29. Apparatus as claimed in claim 28 wherein said programmable power supplies are arranged to deliver said predetermined currents having second components which energize said continuous windings to provide matching magnetic poles on said pair of opposed ferromagnetic bars to provide at least one additional component magnetic field directed along said length of said elongate space.

* * * * *